(12) United States Patent
Anzai et al.

(10) Patent No.: US 7,511,351 B2
(45) Date of Patent: Mar. 31, 2009

(54) SEMICONDUCTOR DEVICE AND METHOD FOR FABRICATING THE SAME

(75) Inventors: Noritaka Anzai, Tokyo (JP); Makoto Terui, Yamanashi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 379 days.

(21) Appl. No.: 11/189,717

(22) Filed: Jul. 27, 2005

(65) Prior Publication Data

US 2005/0263847 A1 Dec. 1, 2005

Related U.S. Application Data

(62) Division of application No. 10/853,662, filed on May 26, 2004, now Pat. No. 7,026,699.

(30) Foreign Application Priority Data

May 26, 2003 (JP) .............................. 2003-148430

(51) Int. Cl.
*G01R 33/09* (2006.01)

(52) U.S. Cl. .............................. 257/422; 257/E21.022; 257/421; 257/531; 257/775; 336/200; 336/223; 29/606

(58) Field of Classification Search .......... 257/E21.022, 257/678, 421, 422, 531, 774, 775, 299, 355, 257/786; 336/200, 223, 232; 29/606, 602.1
See application file for complete search history.

(56) References Cited

U.S. PATENT DOCUMENTS

| | | | | |
|---|---|---|---|---|
| 3,614,554 A | * | 10/1971 | Shield et al. ................. 257/531 |
| 3,858,138 A | * | 12/1974 | Gittleman et al. ........... 336/136 |
| 5,220,298 A | | 6/1993 | Nagase ........................ 333/185 |
| 5,425,167 A | * | 6/1995 | Shiga et al. ................... 29/606 |
| 5,519,582 A | | 5/1996 | Matsuzaki ................... 361/783 |
| 5,576,680 A | * | 11/1996 | Ling .......................... 336/200 |
| 5,936,298 A | | 8/1999 | Capocelli et al. ............. 257/531 |
| 5,966,009 A | | 10/1999 | Asada .......................... 324/97 |
| 6,042,899 A | * | 3/2000 | Ishiguro ..................... 427/548 |
| 6,114,937 A | * | 9/2000 | Burghartz et al. ........... 336/200 |

(Continued)

FOREIGN PATENT DOCUMENTS

JP          03-077360          4/1991

(Continued)

*Primary Examiner*—Chris C. Chu
(74) *Attorney, Agent, or Firm*—Rabin & Berdo, PC

(57) ABSTRACT

In a semiconductor device having a WCSP type construction package, to increase inductance without increasing further an area conventionally occupied by a coil. A pseudo-post part 27 comprising a magnetic body is extended in a direction perpendicular to a main surface 12a of a semiconductor chip 12, on a second insulating layer 21 of a WCSP 10. A first conductive part 15a and a second conductive part 15b constructed as square frames are respectively provided so as to surround the pseudo-post part, on respective top surfaces of a second insulation layer and a third insulating layer 22 which are separated parallel to each other, in an extension direction of the pseudo-post part. A coil 100 being a substantially spiral shape conductive path is formed from, the first conductive part, the second conductive part, and a connection part 26 which electrically connects the one ends of the first and second conductive parts.

3 Claims, 26 Drawing Sheets

U.S. PATENT DOCUMENTS

| | | | |
|---|---|---|---|
| 6,512,298 B2 | 1/2003 | Sahara et al. | 257/773 |
| 6,525,385 B2 | 2/2003 | Inoue et al. | 257/421 |
| 6,977,403 B2 * | 12/2005 | Seto et al. | 257/299 |
| 7,145,332 B2 * | 12/2006 | Park et al. | 324/249 |
| 2002/0090755 A1 | 7/2002 | Matsuzaki et al. | 438/108 |
| 2003/0234436 A1 | 12/2003 | Hsu et al. | 257/531 |

FOREIGN PATENT DOCUMENTS

| | | |
|---|---|---|
| JP | 4-184834 | 7/1992 |
| JP | 04-354308 | 12/1992 |
| JP | 06-120048 | 4/1994 |
| JP | 06-333740 | 12/1994 |
| JP | 07-086507 | 3/1995 |
| JP | 2002-043520 | 2/2002 |
| JP | 2002-057292 | 2/2002 |
| JP | 2002-164468 | 6/2002 |

* cited by examiner

FIG. 19
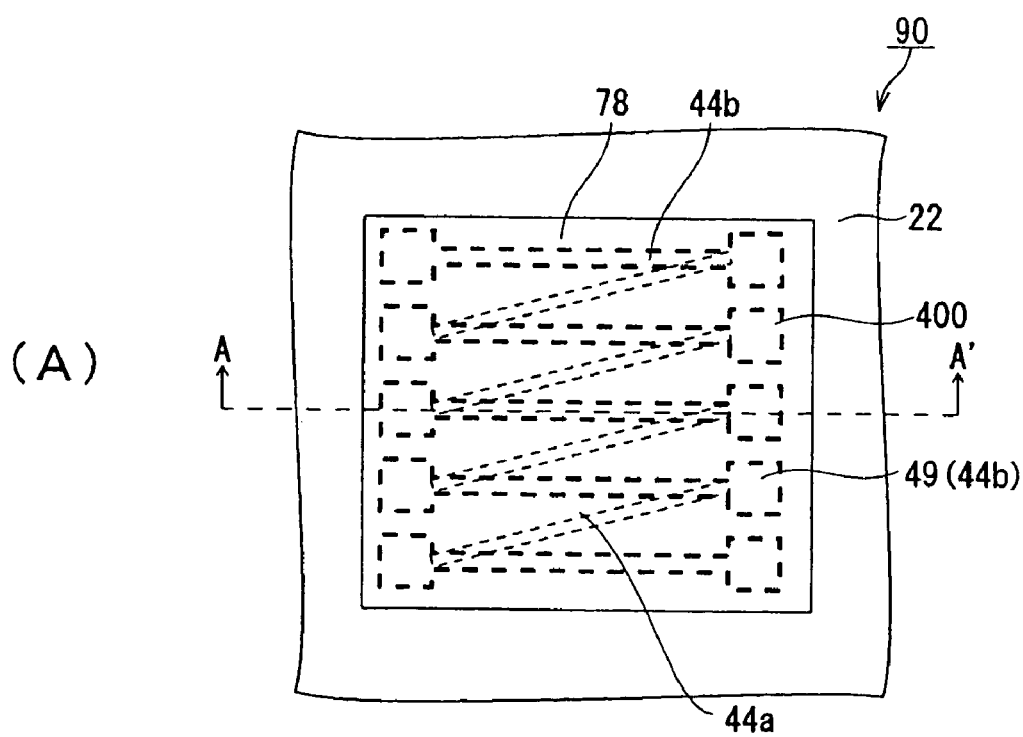
(A)
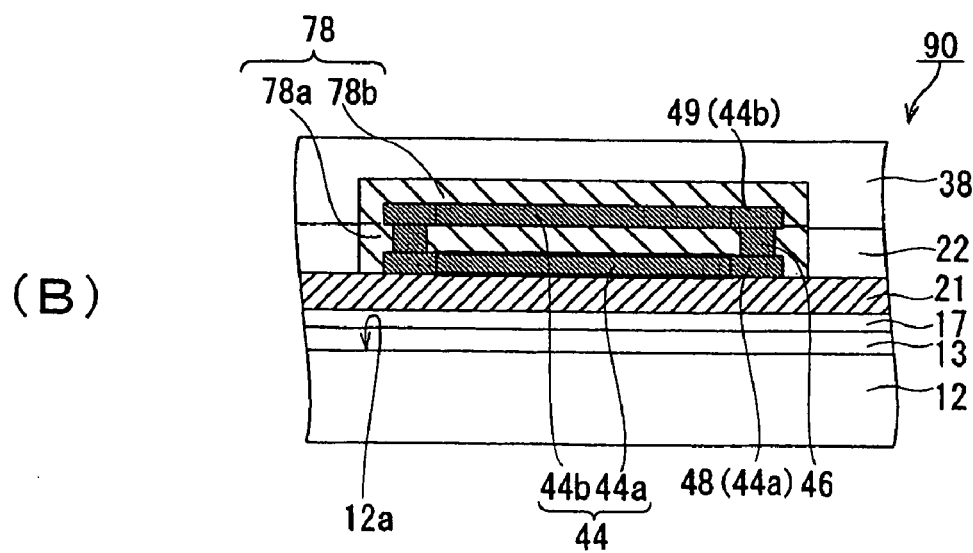
(B)

SEMICONDUCTOR DEVICE AND METHOD FOR FABRICATING THE SAME

This is a Divisional of U.S. application Ser. No. 10/853,662, filed May 26, 2004, now U.S. Pat. No. 7,026,699 the subject matter of which is incorporated herein by reference.

CROSS REFERENCE TO RELATED APPLICATION

This application claims the priority of Application No. 2003-148430, filed May 26, 2003 in Japan, the subject matter of which is incorporated herein by reference.

TECHNICAL FIELD OF THE INVENTION

The present invention relates to a semiconductor device having a WCSP type packaging construction.

BACKGROUND OF THE INVENTION

Recently CSPs (Chip Size Packages), which are semiconductor devices packaged with effectively the same outer dimensions as those of semiconductor chips, have been proposed following a demand for high integration and miniaturization of semiconductor devices used in electronic equipment.

Among such CSPs, WCSPs (Waferlevel CSPs) which are CSPs that are divided into pieces by dicing after the process of forming the external terminals has been completed while still in wafer form, are focused on with a view to reducing production costs (for example, see patent document 1).

WCSPs have a construction having electrodes and external terminals on a semiconductor chip electronically connected to each other via a wiring layer (also called a rewiring layer) which repositions external terminals at desired positions, and has better flexibility of wiring design.

Furthermore, recently with a view to achieving high performance WCSPs, there has been a construction which amplifies the inductance of a WCSP by having a coil built-in as an induction element (also called an inductor) in the WCSP, (for example, see patent document 2).

There are prior art publications as follows:

(1) Japanese Unexamined Patent Publication No. 2002-57292

(2) Japanese Unexamined Patent Publication No. 2002-164468

However, when a spiral coil is mounted on a semiconductor chip for example, the windings of the coil have to be increased further in order to achieve an increase in the inductance of the coil.

However, the proportion of the coil which occupies the surface of the semiconductor chip (that is, the area occupied by the coil) increases by increasing the windings of the coil.

As a result, because enlargement of the semiconductor chip becomes unavoidable, there is the concern that a reduction in the number of semiconductor chips formed from a single wafer leads to a decrease in production efficiency.

OBJECTS OF THE INVENTION

Accordingly, an object of the present invention is to provide a semiconductor device in which an increase in inductance can be realized without increasing further the area conventionally occupied by the coil.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

Therefore, the semiconductor device of the present invention has the following constructional characteristics.

Specifically, the semiconductor device of the present invention is of WCSP type construction packaged in substantially the same outside dimensions as those of the semiconductor chip with which the same semiconductor device is equipped.

Moreover, it has a coil on the top side of the semiconductor chip and a magnetic body is provided in a position surrounded by the coil.

The inductance of the coil when an electric current flows is proportional to the magnetic permeability around the coil. Therefore, according to this construction, it becomes possible to increase the inductance of the coil because the magnetic body is provided in the position surrounded by the coil.

Furthermore, comparing the case in which a magnetic body is provided, with the case in which an inductance of the same degree is to be obtained without providing such a magnetic body, the area occupied by the coil can be reduced, and enlargement of the semiconductor device can be restrained.

According to a first aspect of the present invention, a semiconductor device includes: a semiconductor chip provided with a circuit element a coil provided on an upper side of said semiconductor chip, which is packaged with a dimension effectively the same as an outer dimension of said semiconductor chip; and a magnetic body provided on an upper side of said semiconductor chip, and surrounded by said coil.

According to a second aspect of the present invention, a semiconductor device includes: a semiconductor chip provided with a circuit element; a coil provided on an upper side of said semiconductor chip, which is packaged with a dimension effectively the same as an outer dimension of said semiconductor chip; and a tabular first magnetic layer which is provided along a surface substantially parallel with a main surface of said semiconductor chip, wherein the coil is formed substantially at a position opposing said first magnetic layer.

According to a third aspect of the present invention, a method for fabricating a semiconductor device, which comprises a semiconductor chip provided with a circuit element; and a coil provided on an upper side of said semiconductor chip, which is packaged with a dimension effectively the same as an outer dimension of said semiconductor chip, comprising: a step of forming a magnetic body on an upper side of said semiconductor chip, and at a position surrounded by said coil.

According to a fourth aspect of the present invention, a method for fabricating a semiconductor device, which comprises a semiconductor chip provided with a circuit element; and a coil provided on an upper side of said semiconductor chip, which is packaged with a dimension effectively the same as an outer dimension of said semiconductor chip, comprising the steps of forming a tabular first magnetic body along a surface substantially parallel with a main surface of said semiconductor chip, and forming a coil at a position opposing said first magnetic body.

BRIEF DESCRIPTION OF THE DRAWINGS

FIGS. 19(A) and 19(B) are diagrams accompanying a description of a semiconductor device of a ninth embodiment of this invention.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Embodiments of the present invention are described below with reference to FIG. 1 through FIG. 26. Each of the drawings shows schematically one configuration example of a semiconductor device according to the present invention. Also, each of the drawings merely shows schematically the forms, dimensions and positions of each component in order to allow understanding of the present invention, and does not restrict the present invention to these examples shown. Also, hatching (diagonal lines) which shows cross-sectional views has been omitted except in one part, in order to make the diagram easier to understand. Moreover, although certain materials and conditions have been employed in the following description, these materials and conditions are merely one preferred example, and hence nothing is restricted by them. Furthermore, the same components in each of the drawings are denoted with the same reference symbols, and repeated descriptions may be omitted.

Also, in each of the embodiments described below, each of the individual CSP pieces divided by means of dicing is called a WCSP, and the description takes these WCSPs as examples of a semiconductor device.

First Embodiment

Figure 1:
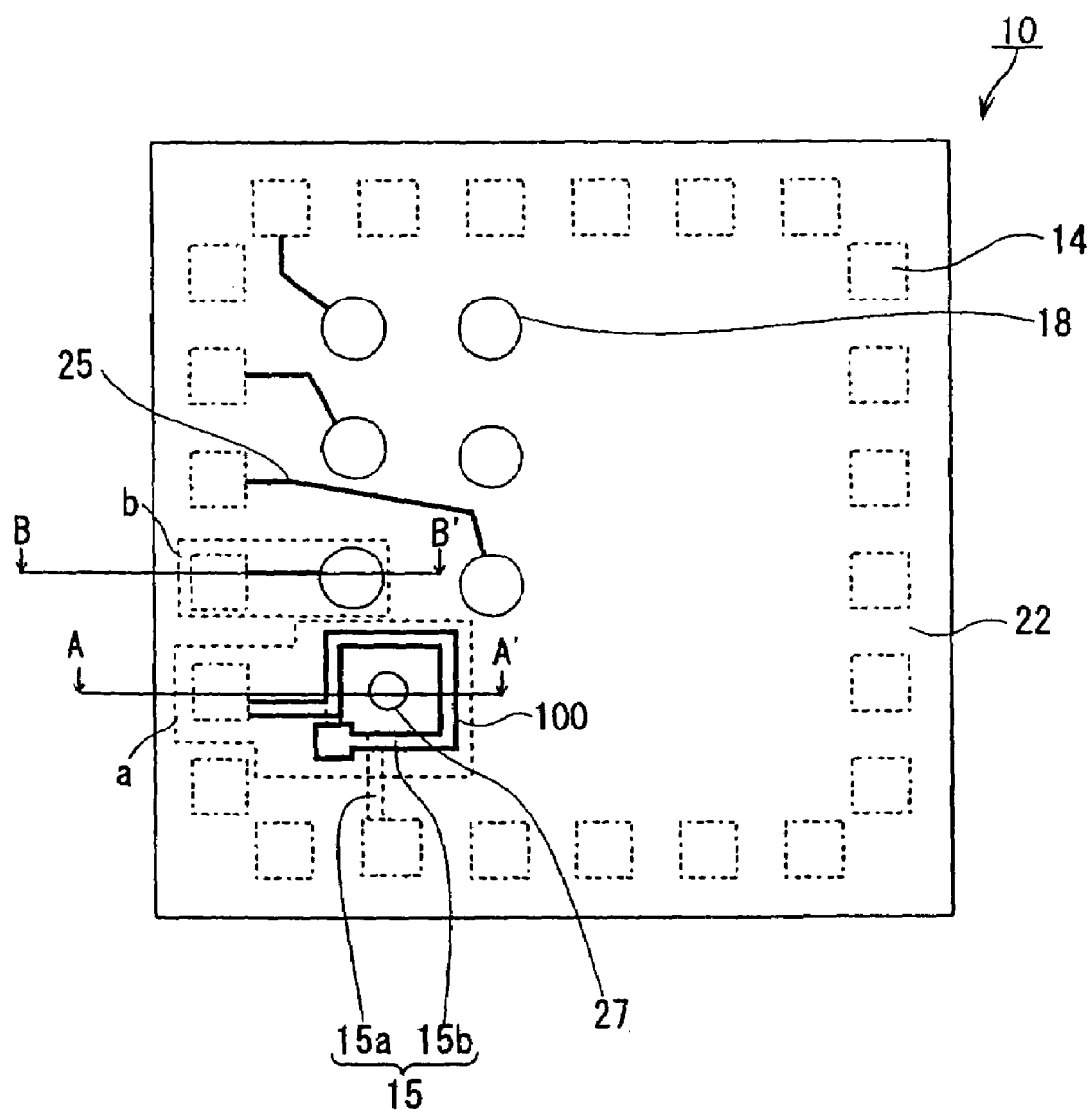
FIG. 1 is a diagram accompanying the description of a semiconductor device of a first embodiment of this invention.
Figure 2:
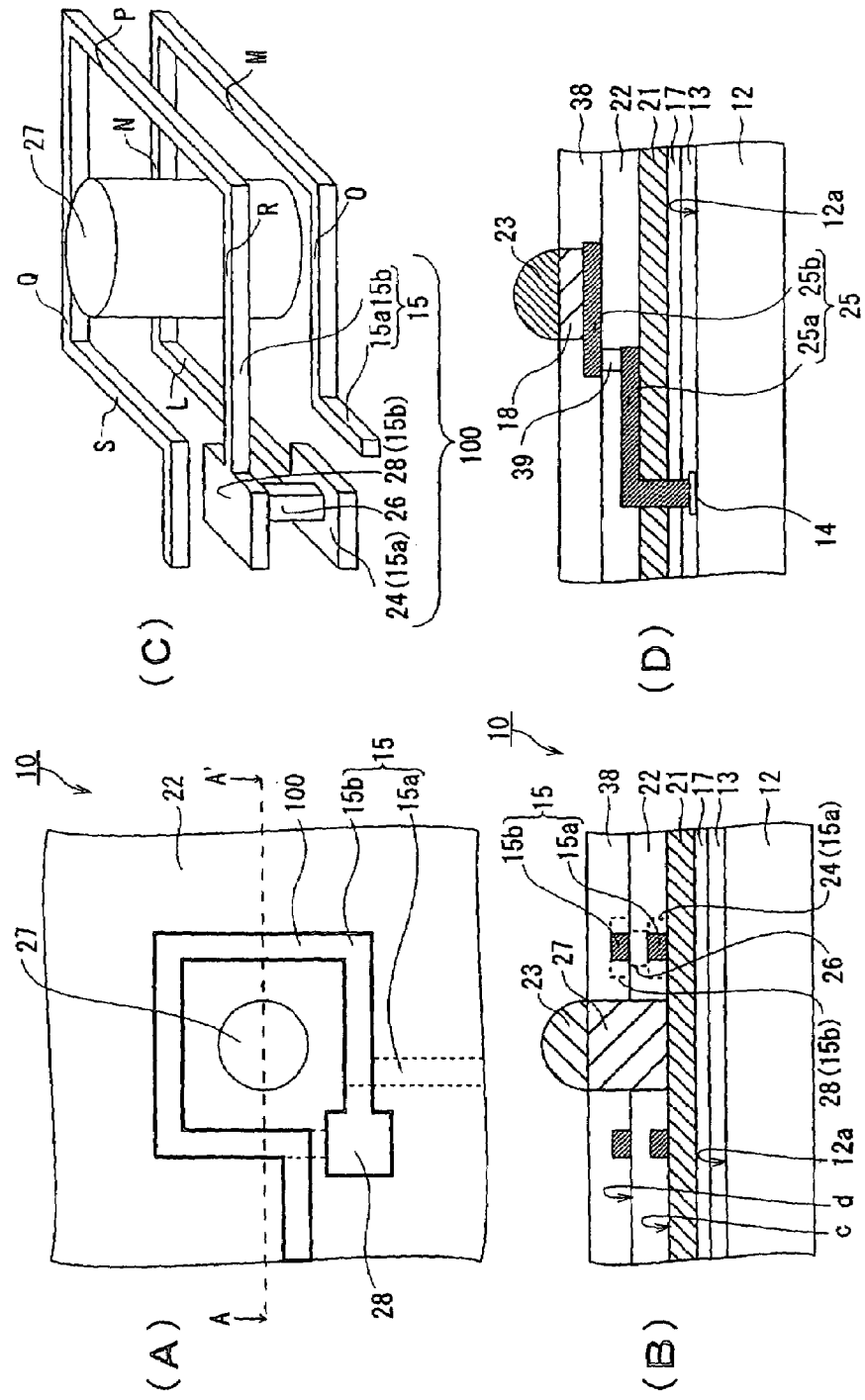
FIGS. 2(A) to 2(D) are diagrams accompanying a description of the semiconductor device of the first embodiment of this invention.

A semiconductor device according to a first embodiment of the present invention is described with reference to FIG. 1 through FIG. 4. FIG. 1 is a schematic plan view omitting some components of a WCSP 10 which is the semiconductor device of this embodiment. In particular this is a diagram that shows the outline of each of the components drawn with solid lines, in order to show clearly the form and positional relationship of each components such as an electrode pad, a conductive part, a post part, a wiring layer and a pseudo-post part, and so on, on the semiconductor chip. Furthermore, FIG. 2(A) is a diagram schematically showing an enlargement of a first area shown in the plan view of FIG. 1 surrounded by a broken line "a", with an external terminal and a sealing layer omitted. Also, FIG. 2(B) is a simplified cross-sectional view showing an example of a component part corresponding to the section (specifically cross-section) obtained by cutting FIG. 1(A) along the broken line part A-A'. Moreover, FIG. 2(C) is a simplified perspective view showing one example of the positional relationship of a coil 100 and a pseudo-post part 27 comprising a magnetic body. Furthermore, FIG. 2(D) is a simplified perspective view showing one example of a component part corresponding to a cut face obtained by cutting a second area surrounded by the broken line b shown in the plan view of FIG. 1 along the line B-B' (in each of the following embodiments, the diagram corresponding to FIG. 1 is omitted, and sometimes description is with reference to diagrams corresponding to this enlarged schematic diagram).

In FIG. 1, for the sake of convenience, illustration of a sealing layer 38 comprising a coating of organic resin and so forth provided in the WCSP 10, and an external terminal 23, are omitted, and illustration of some parts of a wiring layer 25 and a post part 18 are also omitted.

As shown in FIG. 1, the WCSP 10 has a plurality of electrode pads 14 made of aluminum shown by a dotted line, positioned along the periphery of a main surface 12a of a semiconductor chip 12 which has circuit elements at predetermined intervals. The WCSP 10 shown here has a square planar shape, and the electrode pads 14 are positioned in a straight line along each of the edges. The wiring construction of the WCSP 10 is formed by the electrode pads 14 and external terminals (not shown) formed on the post parts 18 being connected electrically by a wiring layer 25 (also known as a rewiring layer).

Furthermore, the coil 100 is provided on the main surface 12a side of the semiconductor chip 12 in this embodiment. The coil 100 is formed with a wiring that has a pair of electrode pads 14 connected at both of its ends.

Specifically, as shown in FIGS. 2(A) and (B), the WCSP 10 of this embodiment has a laminated structure having a first insulating layer 13, a passivation coating 17, a second insulating layer 21, a third insulating layer 22, and a sealing layer 38 formed sequentially on the semiconductor chip 12. The first insulating layer 13 is formed from silicon dioxide coating ($S_iO_2$). The passivation coating 17 is formed with silicon nitride coating ($S_iN$). The second insulating layer 21 and the third insulating layer 22 are formed from low-viscosity polyimide resin coating, and this inhibits impact to the semiconductor chip 12 in the production process, and exfoliation caused by the stress between the semiconductor chip 12 and the sealing layer 38. The sealing layer 38 is formed from epoxy resin.

Moreover, in this embodiment, a cylindrical pseudo-post part 27 made from a magnetic body is formed on the second insulating layer 21 in a direction away from the semiconductor chip 12, that is, perpendicular to the main surface 12a of the semiconductor chip 12. In the diagram of the example, the pseudo-post part 27 is provided perpendicular to the main surface of the semiconductor chip 12. The pseudo-post part 27 passes through the insulating layer 22 and the sealing layer 38, and its top end surface is exposed out of the sealing layer 38 and is formed as the same surface with the top surface of the sealing layer 38. In other words, the top end surface of the pseudo-post part 27 forms a continuous surface with the sealing layer 38. Also, this pseudo-post part 27 is a quasi post part (that is, a dummy) which is not electrically connected to the semiconductor chip 12. The pseudo-post part 27 of this configuration example is formed from iron (Fe) which is a ferromagnetic material.

Furthermore, as shown in FIG. 2(C), the coil 100 is provided so that it surrounds the pseudo-post part 27. The coil 100 is formed as a substantially spiral shaped conductive path which extends in the extension direction of the pseudo-post part 27, that is, in the direction perpendicular to the main surface 12a. Here, "spiral" in "substantially spiral shape" also includes the case of any shape that can be considered a spiral, for example a hierarchical configuration formed with two or more layers electrically connected.

The coil 100 is described below.

The coil 100 has a conductive part 15 comprising a pair of a first conductive part 15a and a second conductive part 15b. These first and second conductive parts (15a and 15b) are provided in a thin line form hierarchically isolated in the direction perpendicular to the main top surface of the semiconductor chip 12. Specifically, the first and second conductive parts (15a and 15b) are provided so as to respectively surround the pseudo-post part 27 on a first plane c and a second plane d. The first and second conductive parts (15a and 15b) are formed from copper (Cu).

Specifically, the first plane c is taken as the surface of the second insulating layer 21. The first conductive part 15a is constructed as a square frame part surrounding the pseudo-post part 27 on the first plane c. Moreover, the first conductive part 15a has single conducting wires L, M, N and O respectively corresponding to each edge of the square. The single conducting wire L faces the single conducting wire M, and the ends of the single conducting wire L and the single conducting wire M on the same side are respectively connected by the single conducting wire N, and the single conducting wire O extends from the other end of the single conducting wire M toward the other end of the single conducting wire L and does not contact with the single conducting wire L.

Also, in the same way, the second conductive part 15b is formed corresponding to the conductive part 15a on the top surface of the third insulating layer 22, which is the second plane d, and is constructed as a square frame surrounding the pseudo-post part 27. Moreover, the conductive part 15b has a single conducting wire P corresponding to the single conducting wire M, a single conducting wire Q which is connected to one end of the single conducting wire P and corresponds to the single conducting wire N, a single conducting wire R which is connected to the other end of the single conducting wire P and corresponds to the single conducting wire O, and a single conducting wire S which is connected to the opposite end of the single conducting wire Q, and extends toward the other end of the single conducting wire R, and does not make contact with the single conducting wire R and corresponds to the single conducting wire L. These single conducting wires P, Q, R, and S correspond to each of the four sides of a square.

Furthermore, the coil 100 of this embodiment has the other end of the single conducting wire L of the first conductive part 15a and the other end of the single conducting wire R of the second conductive part 15b electrically connected by a connection part 26 extending perpendicularly from the main surface 12a of the semiconductor chip 12. Therefore, the coil 100 is a coil provided with respective hierarchic conductive parts, and the entire coil may be said to have a substantially spiral configuration. The connection part 26 is connected to each land (24 and 28) formed respectively at the terminal parts of the first and second conductive parts (15a and 15b), and is formed from copper.

Moreover, in this configuration example, because the pseudo-post part 27 is provided at the position corresponding to the central axis of the coil 100, magnetic permeability around the coil is uniformized in the circumferential direction around the central axis of the coil 100. Therefore, the inductance when electric current flows in the coil can be efficiently increased.

Furthermore, the coil 100 of this configuration example has parts that are formed from a conductive member common with the conductive member constituting the rewiring layer of the WCSP 10 (the same applies to each of following embodiments).

As shown in FIG. 2(D), the WCSP 10 has each electrode pad 14 electrically connected to a corresponding external terminal 23 such as a solder ball via a dedicated rewiring layer 25, a connection part 39 and a post part 18. Specifically, in the WCSP 10, by going through the rewiring layer 25, the external terminal 23 can be shifted and positioned in the desired position on the top side of the semiconductor chip 12 regardless of the position of the electrode pad 14.

Here, regarding the wiring construction of the WCSP 10 of this embodiment, as an example, a first rewiring layer 25*a* is formed which is electrically connected to the electrode pad 14 on the second insulating layer 21. Furthermore, the first rewiring layer 25*a* is electrically connected via the connection part 39 to a second rewiring layer 25*b*, which is formed on the third insulating layer 22 in order to provide a degree of freedom better flexibility in positioning the external terminal 23. The second rewiring layer 25*b* is electrically connected via the post part 18 to the external terminal 23. The first and second rewiring layers (25*a* and 25*b*), the connection part 39 and the post part 18 are formed from copper.

The first and second conductive parts (15*a* and 15*b*) are comprised of the same material as the first and second rewiring layers (25*a* and 25*b*), and have the same thickness.

Figure 3:
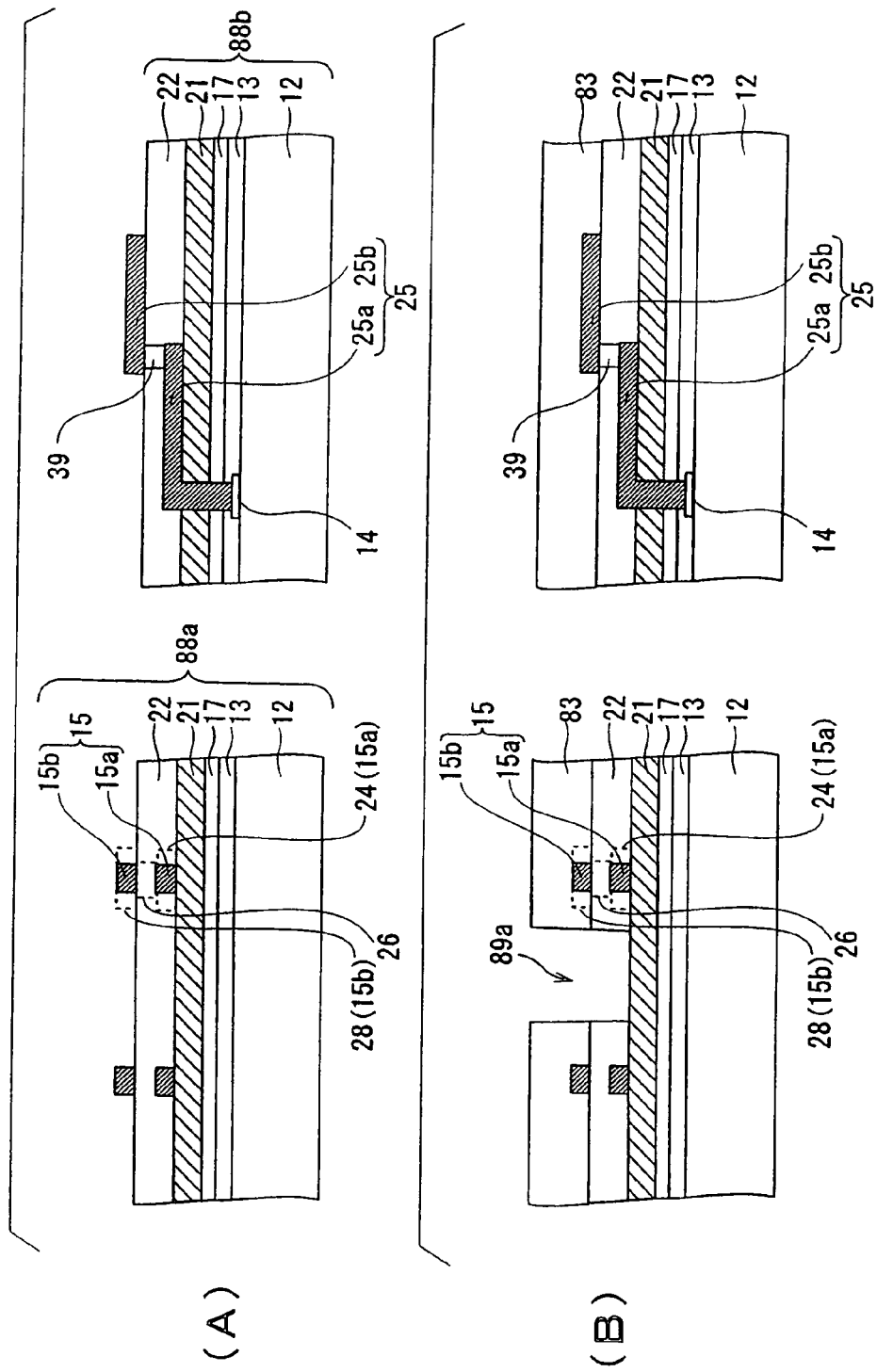
FIGS. 3(A) and 3(B) are diagrams (first) accompanying the description of a production method for the semiconductor device of the first embodiment of this invention.
Figure 4:
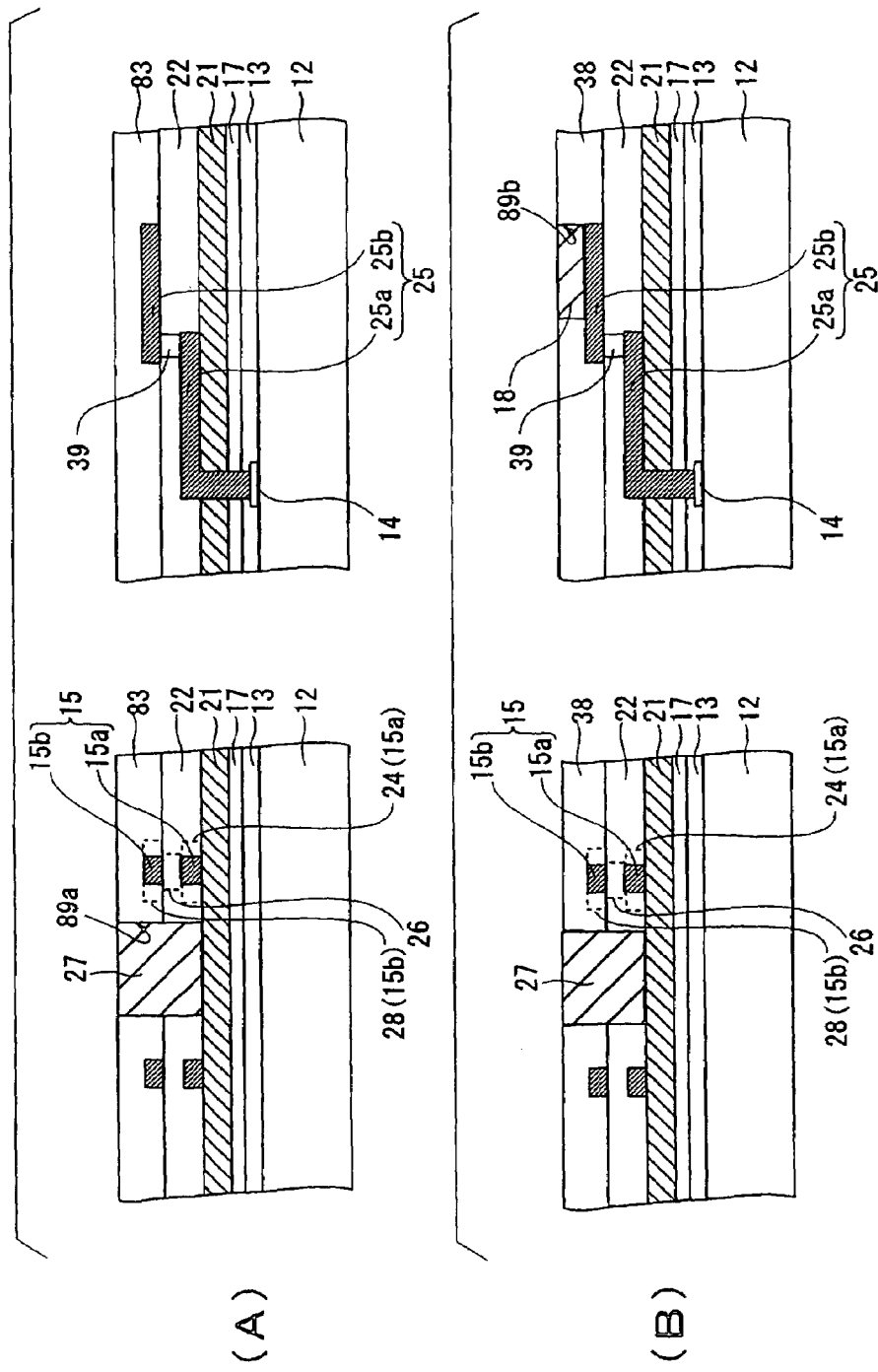
FIGS. 4(A) and 4(B) are diagrams (second) accompanying the description of the production method for the semiconductor device of the first embodiment of this invention.

Next, a production method for the WCSP 10 which is the semiconductor device of this embodiment is described hereunder, with reference to FIG. 3 and FIG. 4. The part corresponding to the first area ((B) in FIG. 2) is shown on the left side, and the part corresponding to the second area ((D) in FIG. 2) is shown on the right side in FIG. 3 and FIG. 4.

Firstly, the first insulating layer 13 formed of silicone oxide coating, the passivation coating 17 formed of silicon nitride coating, and the second insulating layer 21 formed of polyimide resin coating are sequentially formed by means of any suitable method on the semiconductor chip 12. Next, a resist layer pattern corresponding to the first rewiring layer 25*a* and the first conductive part 15*a* is formed on the second insulating layer 21 by means of a photolithography process, and then sputtering is carried out to form the first rewiring layer 25*a* and the first conductive part 15*a* at the same time. At this point, the land 24 is formed at the end part of the first conductive part 15*a* to which a later-mentioned second conductive part 15*b* is connected. After that, the connection parts 39 and 26 formed from copper are each formed on the first rewiring layer 25*a* and on the land 24 of the end part of the first conductive part 15*a* by means of the photolithography process and plating. Then, the third insulating layer 22 is formed on the second insulating layer 21 to cover the sides of each connection part (39 and 26). After that, a resist layer pattern corresponding to the second rewiring layer 25*b* and the second conductive part 15*b* is formed on the third insulating layer 22 by means of the photolithography process. Then, the second rewiring layer 25*b* and the second conductive part 15*b* electrically connected to each of the connection parts (39 and 26) are formed at the same time by means of sputtering. At this point, the land 28 is formed at one of the end parts of the second conductive part 15*b* which is connected to the first conductive part 15*a* via the connection part 26.

In this way, a first laminate 88*a* shown on the left side of FIG. 3(A) is formed in the part corresponding to the first area surrounded by the broken line a in FIG. 1 (hereunder, this process is called the first laminate forming process). Also, a second laminate 88*b* shown on right side of FIG. 3(A) is formed in the part corresponding to the second area surrounded by the broken line b in FIG. 1 (hereunder, this process is called the second laminate forming process).

In this embodiment, the first and second conductive parts (15*a* and 15*b*) which constitute the coil 100 and the first and second rewiring layers (25*a* and 25*b*), which are formed from copper and constitute the wiring part of the WCSP, are respectively formed at the same time by means of patterning. Here, because in each of the following embodiments, the production process for the wiring part of the WCSP is substantially the same as that described above, detailed descriptions thereof are omitted. Furthermore, depending on the purpose and design, there are cases where the second rewiring layer 25*b* is not formed in the wiring part of the WCSP. However in these cases a second conductive part just for constructing the coil may be formed separately.

In the embodiment described above, the coil can be formed from a low resistance conductive material such as copper, as opposed to the case of forming the coil in a semiconductor chip from aluminum (Al) which is a common circuit wiring material for semiconductor chips.

Therefore, the resistance of the wiring can be lowered when an electric current flows, and accordingly a high Q-value, which is the reference index showing low energy loss (or transmission loss) can be obtained.

Next, after a dry film 83 is applied to the top of the first and second laminates (88*a* and 88*b*), an aperture 89*a* with a depth from the top surface of the film 83 on the first laminate 88*a* side to the surface of the second insulating layer 21 is formed. This aperture 89*a* exposes a part of the top surface of the second insulating layer 21, and is used to form the pseudo-post part (FIG. 3(B)).

Then, the aperture 89*a* is filled up with iron, which is a ferromagnetic material, by means of plating, and the pseudo-post part 27 is formed (FIG. 4 (A)). As alternative materials for forming the pseudo-post part 27, metallic materials such as nickel (Ni), cobalt (Co) and so forth, and insulating materials such as ferrite ($MO.Fe_2O_3$ (M: Mn, Fe, Co; Ni, Cu, Zn, Mg, Cd, etc.) and so forth can be used. Furthermore, forming the pseudo-post part 27 can also be carried out, depending on the magnetic material used, for example, by means of coating the aperture part 89 with an embrocation containing magnetic material. Alternatively, a pre-formed pseudo-post part 27 can be inserted into the aperture 89*a*.

Then, after the dry film 83 is removed, a new dry film is formed (not shown), and a part of the surface of the second rewiring layer 25*b* is exposed by means of the photolithography process. In this way, another aperture 89*b* for forming a post part described below is formed. Then, after the dry film (not shown) is removed, an epoxy resin which becomes the sealing layer 38 is formed to the degree at which the pseudo-post part 27 and the post part 18 are covered, by means of transfer molding. After that, the epoxy resin is abraded with an abrasive tool such as a grinder, and the top surface of the pseudo-post part 27 and the post part 18 are exposed (FIG. 4(B)).

Then, the external terminal 23 is formed on the top surface of the exposed pseudo-post part 27 and the post part 18 by means of reflowing (see FIGS. 2(B) and (D)).

As previously described, inductance of the coil is proportional to the magnetic permeability around the coil. Therefore, according to this embodiment, the inductance of the coil can be increased by the magnetic body provided in the position surrounded by the coil, as is evident from the description above.

Moreover, because the pseudo-post part is provided in the position corresponding to the central axis of the coil, magnetic permeability around the coil is uniform in the circumferential direction around the central axis of the coil, and therefore, stable inductance of the coil can be obtained.

Furthermore, comparing the construction in which a magnetic body is provided, with the case in which an inductance of the same degree is to be obtained without providing such a magnetic body, the area occupied by the coil can be reduced, and enlargement of the semiconductor device can be restrained.

Second Embodiment

Figure 5:
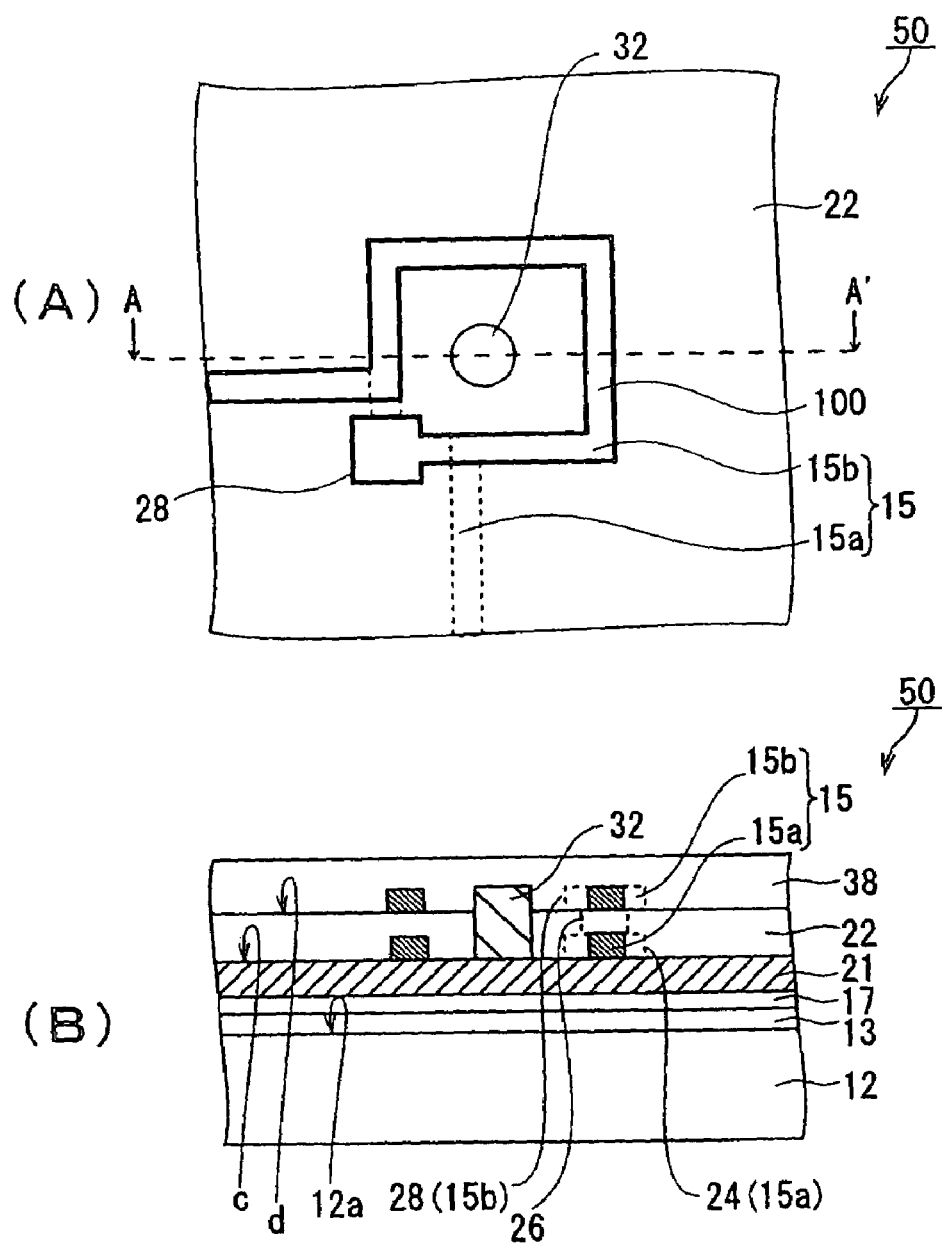
FIGS. 5(A) and 5(B) are diagrams accompanying a description of a semiconductor device of a second embodiment of this invention.

A semiconductor device according to a second embodiment of the present invention is described with reference to FIG. 5 and FIG. 6. FIGS. 5(A) and (B) are a simplified plan view, and an A-A' cross sectional view corresponding to FIGS. 2(A) and (B) respectively, and FIGS. 6(A) and (B) are production process diagrams which focus on and describe the part corresponding to FIG. 5(B).

In the first embodiment mentioned above the external terminal 23 is provided on the end surface of the pseudo-post part 27. However the second embodiment differs from the first embodiment principally in that the end surface of the pseudo-post part does not have an external terminal and is covered by the sealing layer 38. In the second embodiment, the pseudo-post part without an external terminal provided is described as a magnetic core part 32. Also, the same components previously described in the first embodiment are shown with the same reference symbols, and their descriptions may be omitted (the same applies to each of the following embodiments).

As shown in FIGS. 5(A) and (B), on the second insulating layer 21 of a WCSP 50 in this embodiment, is formed the cylindrical magnetic core part 32 passing through the third insulating layer 22 with its top end surface covered with the sealing layer 38. Also, the diameter of the magnetic core part 32 in this embodiment is formed to be smaller than the diameter of the pseudo-post part 27 in the first embodiment (described later). Furthermore, in FIG. 5(A), the sealing layer 38 is not shown, and the conductive parts (15a and 15b) and the magnetic core part 32 are shown with solid lines and broken lines in order to show their configurations and positional relationship.

Figure 6:
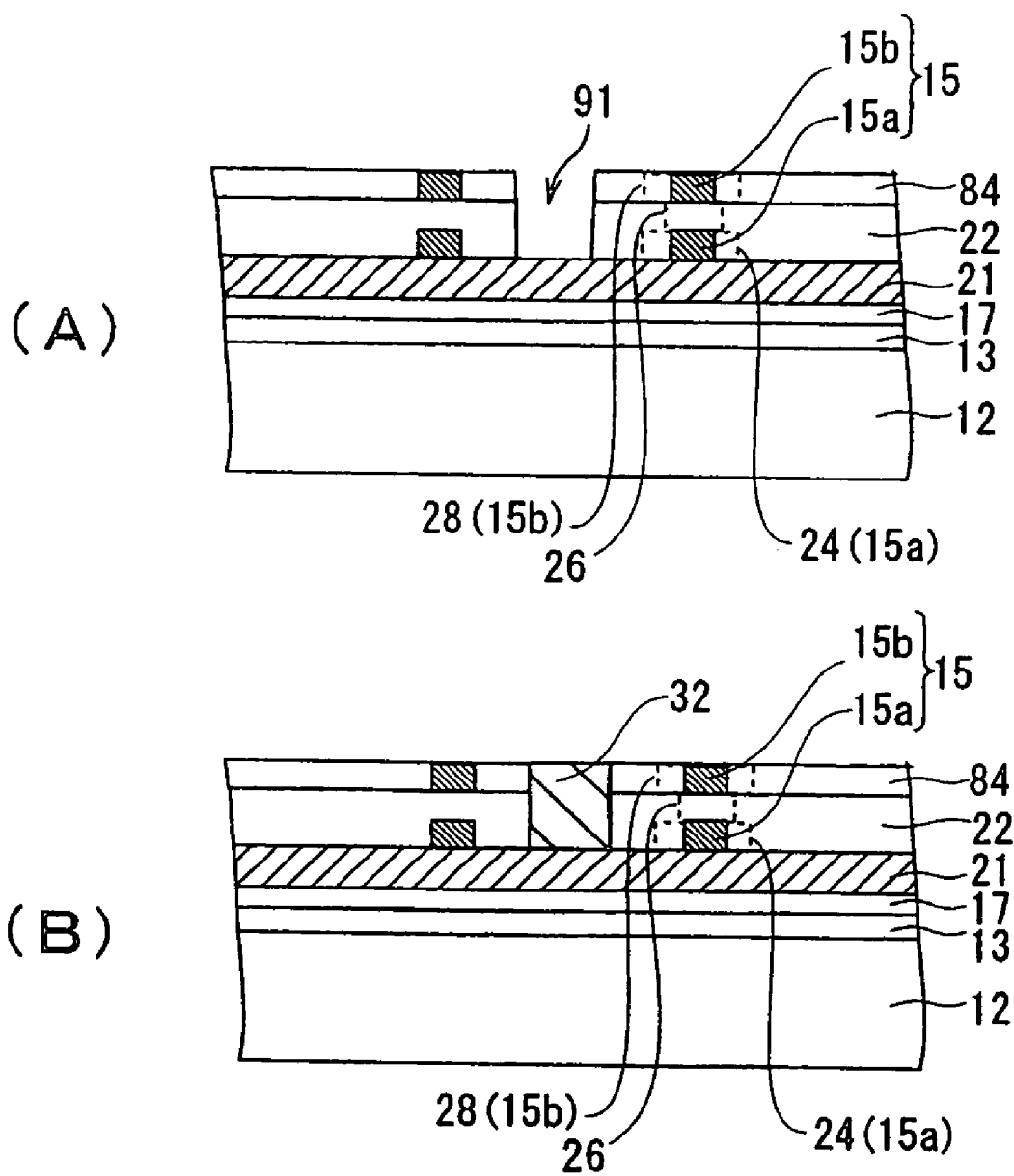
FIGS. 6(A) and 6(B) are diagrams accompanying the description of a production method for the semiconductor device of the second embodiment of this invention.

Next, a production method for the WCSP 50 which is the semiconductor device of this embodiment is described hereunder, with reference to FIG. 6.

Firstly, the process of forming the first laminate is carried out by the same method of the first embodiment to obtain the first laminate 88a (see FIG. 3(A)).

Then, after the resist layer 84 is formed on the first laminate 88a, some part of the surface of the second insulating layer 21 is exposed by means of a photolithography process, and then an aperture 91 for forming a magnetic core part is formed (FIG. 6(A)).

In the first embodiment, because coating the resist layer evenly with a matching thickness by means of a spin coat method or similar is difficult when forming the deep aperture 89 for forming the pseudo-post part, the aperture 89 is formed by coating a dry film (FIG. 3(B)). Therefore, in the first embodiment, when forming the deep aperture corresponding to the sufficiently thick dry film, the diameter of the aperture becomes large (the minimum aperture diameter is approximately $1.5 \times 10^5$ nm).

However, in the second embodiment, observing that the resist layer can be formed evenly as a coating even if it is a thin coating, a shallow aperture 91 for forming the magnetic core part is formed by carrying out a photolithography process on the resist layer 84. Therefore, the aperture diameter can be made smaller than that of the first embodiment (the minimum aperture diameter is approximately $1.5 \times 10^5$ nm).

Then, the aperture 91 is filled up with iron, which is a ferromagnetic material, by means of a plating method, and a cylindrical magnetic core part 32 having a smaller diameter than the first embodiment is formed (FIG. 6(B)).

Next, after the resist layer 84 is removed, the sealing layer 38 having the magnetic core part 32 and the second conductive part 15b embedded therein is formed on the third insulating layer 22 (FIG. 5(B)).

As is apparent from the above description, with this embodiment, the same effect as for the first embodiment can be obtained.

Furthermore, in this embodiment, the diameter of the magnetic core part can be formed smaller than the diameter of the pseudo-post part of the first embodiment.

Consequently, in the case of a construction which allows for a sufficient increase in inductance by providing such a magnetic core part, WCSPs of an even smaller scale can be obtained by employing this embodiment, which can reduce the area occupied by the coil more than for the first embodiment.

Third Embodiment

Figure 7:
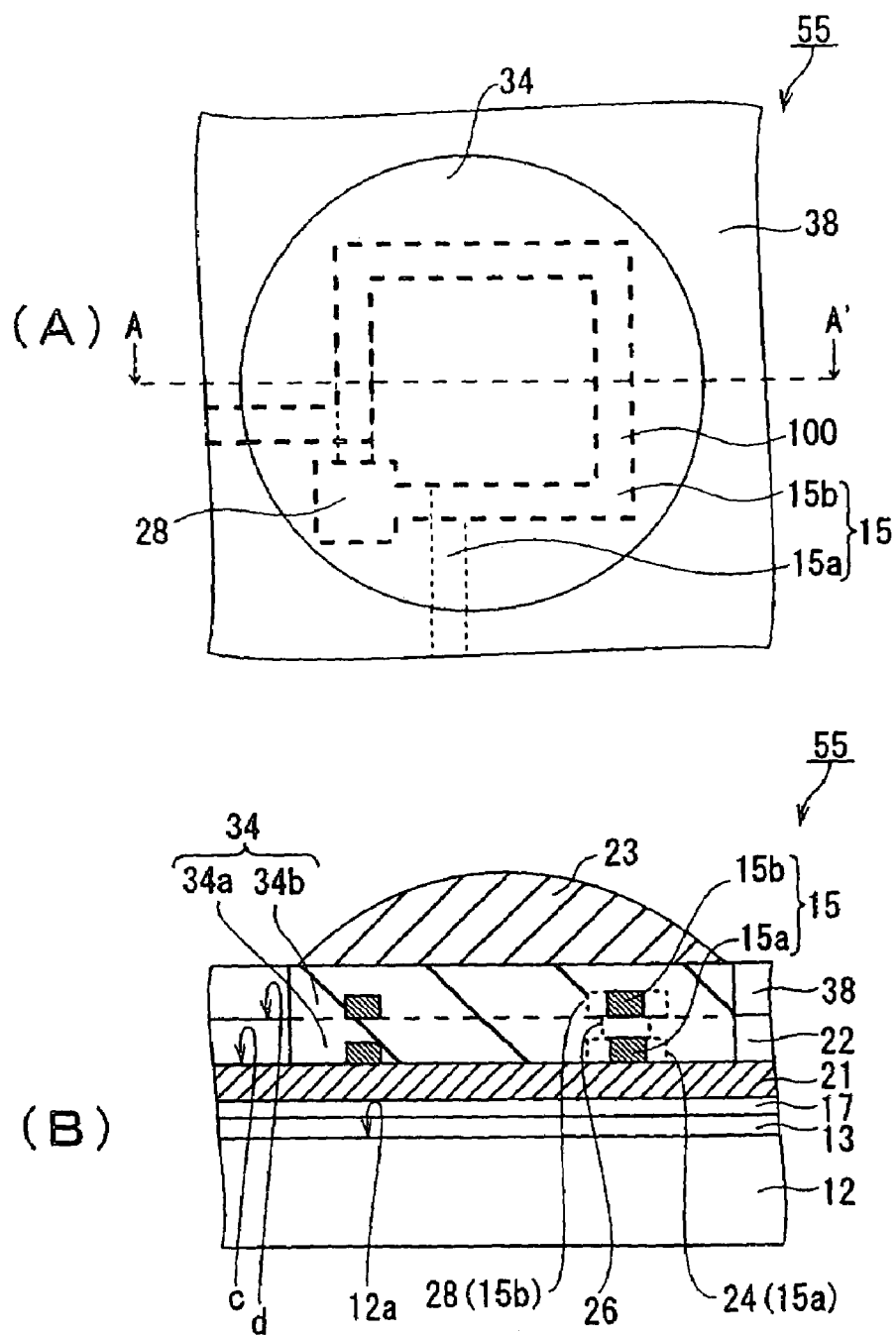
FIGS. 7(A) and 7(B) are diagrams accompanying a description of a semiconductor device of a third embodiment of this invention.

A semiconductor device according to a third embodiment of the present invention is described with reference to FIG. 7, through FIG. 9. FIGS. 7(A) and (B) are a simplified plan view and a cross sectional view A-A' of the same type as (A) and (B) in FIG. 2. FIG. 8(A) through (C) are production process diagrams describing particularly the part corresponding to (B) in FIG. 7. FIGS. 9(A) and (B) are production diagrams which follow FIG. 8(C). In FIG. 7(A), the external terminal is omitted. Moreover, each of the production process diagrams are sectional views on the cut face.

The main point of difference between this embodiment and the first embodiment is that the entire coil 100 which functions as a coil is embedded in the pseudo-post part 34 which is made from insulating material.

As shown in FIGS. 7(A) and (B), on the second insulating layer 21 of a WCSP 55 in this embodiment, is formed the pseudo-post part 34 with the coil 100 substantially embedded therein except for a part on the side which connects to the electrode pad of the first conductive part 15a, and its top end surface exposed out of the sealing layer 38. Because the pseudo-post part 34 of this embodiment is formed from insulating material such as ferrite, there is no concern of the coil 100 short-circuiting.

Figure 8:
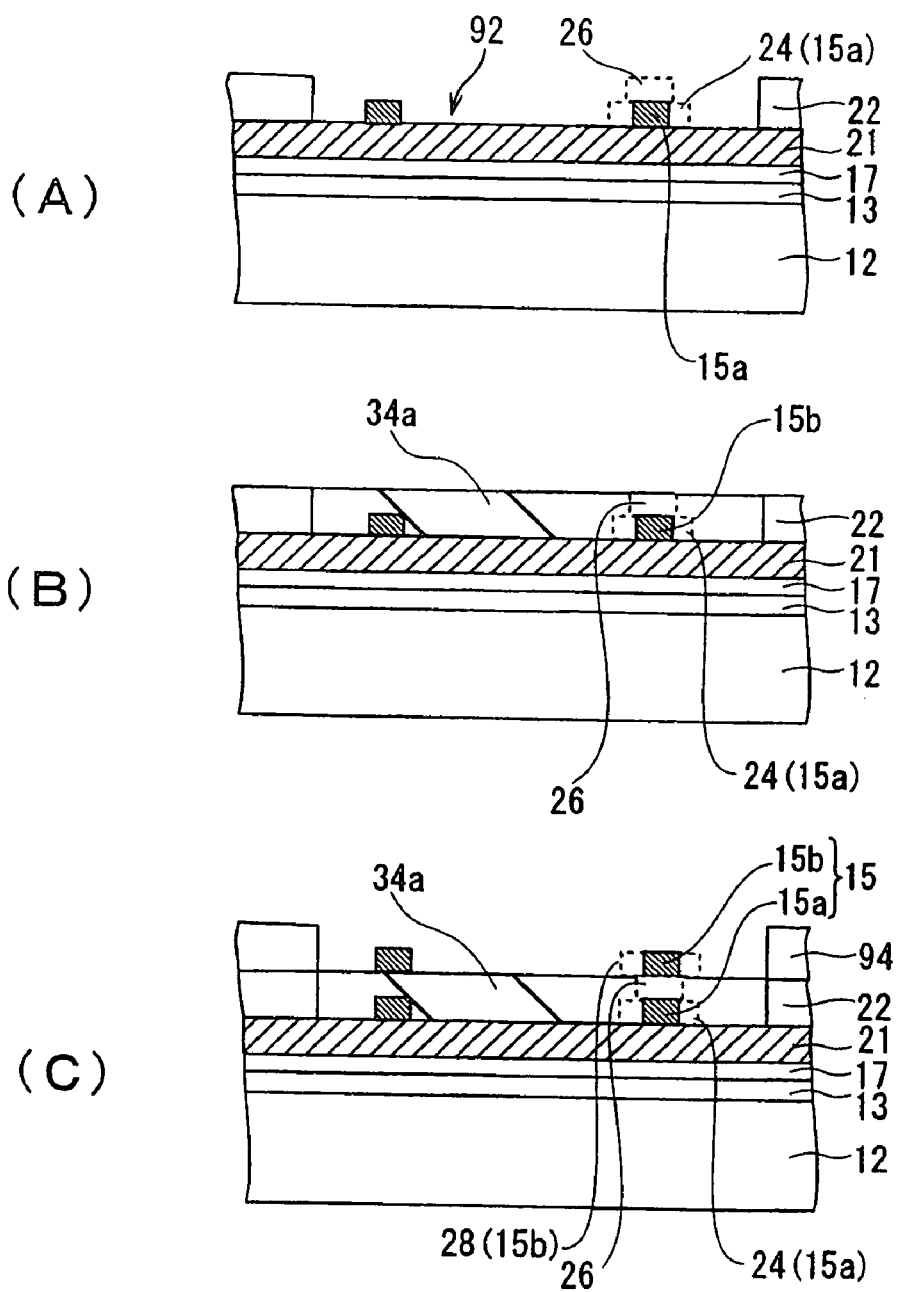
FIGS. 8(A) to 8(C) are diagrams (first) accompanying a description of a production method for the semiconductor device of the third embodiment of this invention.
Figure 9:
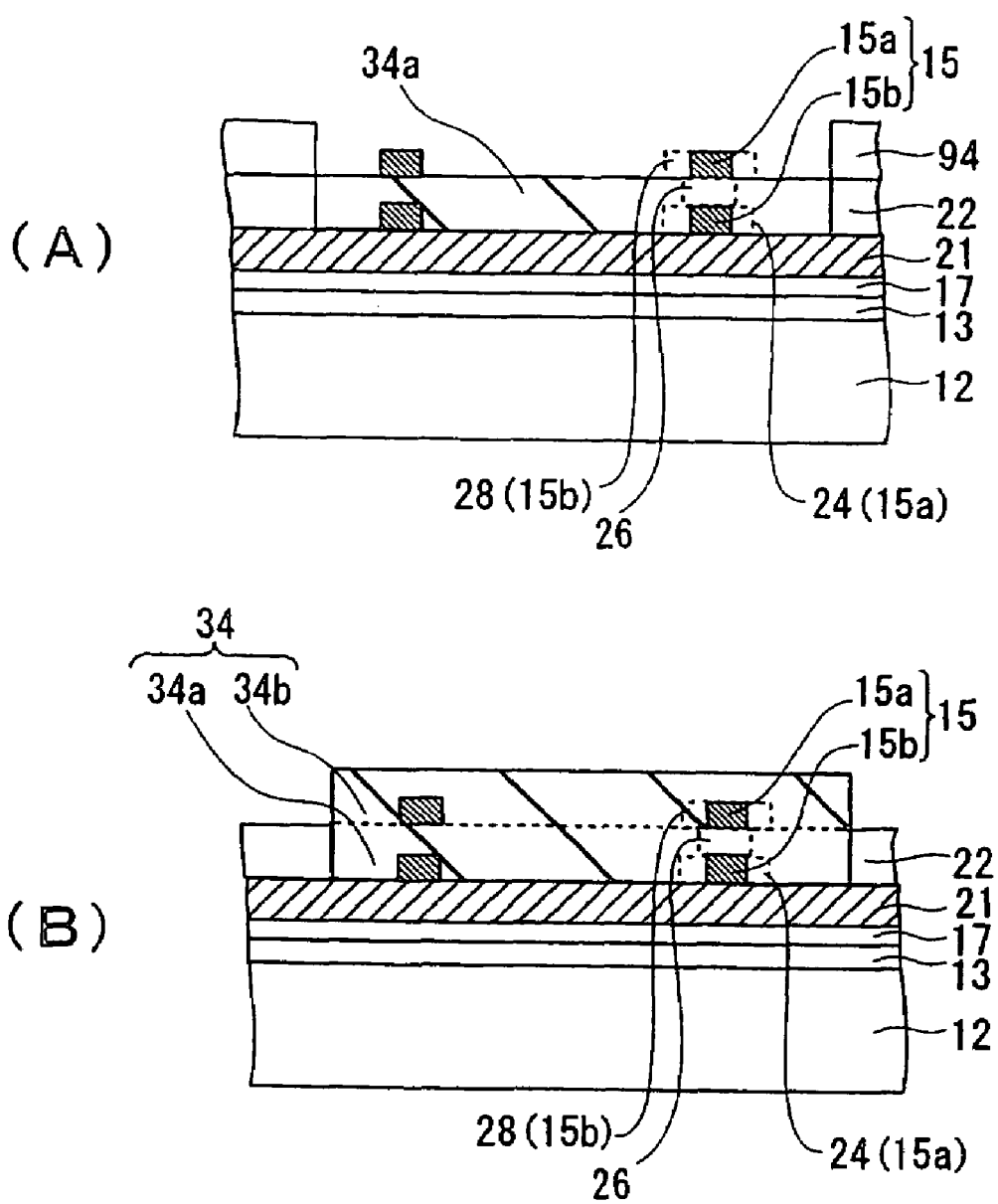
FIGS. 9(A) and 9(B) are diagrams (second) accompanying the description of the production method for the semiconductor device of the third embodiment of this invention.

Next, a production method for the WCSP 55 which is the semiconductor device of this embodiment is described hereunder, with reference to FIG. 8 and FIG. 9.

Firstly, the first conductive part 15a made from copper is formed by patterning on the second insulating layer 21 by means of a photolithography process and sputtering and so forth. Then a connection part 26 (shown in broken lines) is formed on the land 24 (shown in broken lines) of the first conductive part 15a. After that, the third insulating layer 22

(FIG. 8(A)), having the aperture 92 set out in the area where the pseudo-post part 34 is formed, is formed on the second insulating layer 21.

Next, a polyimide containing ferrite, which is a ferromagnetic material having insulation properties, is coated over the aperture 92. Then the first pseudo-post part 34a is formed by curing the polyimide by means of heat treatment. At this point, the top end surface of the connection part 26 is exposed out of the surface of the first pseudo-post part 34a (FIG. 8(B)).

Subsequently, the second conductive part 15b made from copper and having a land 28 (shown in broken lines) electrically connected to the connection part 26, is formed by patterning on the third insulating layer 22, by means of a photolithography process and sputtering and so forth (FIG. 8(C)).

Then, a dry film 94 is formed by patterning on the third insulating layer 22, by means of a photolithography process (FIG. 9(A)).

Then, after polyimide containing ferrite is coated over the first pseudo-post part 34a exposed out of the dry film 94, a second pseudo-post part 34b is formed by curing the polyimide by means of heat treatment. After that, the dry film 94 is removed, and the pseudo-post 34 comprising the first pseudo-post part 34a and the second pseudo-post part 34b is formed (FIG. 9(B)). Then, a sealing layer 38 and an external terminal 23 are formed in sequence (FIG. 7(B)).

In the first embodiment, an insulating layer must be provided between the pseudo-post part 27 and the coil 100 to prevent them from contacting when the pseudo-post part 27 is formed with a magnetic body made from metallic material.

However, because the third embodiment has a construction having the coil 100 which functions as a coil embedded in the pseudo-post part 34 which is made of insulating material, high-precision patterning is not required as it is within the first embodiment. Therefore, compared to the first embodiment, concern regarding the production yield is eased. When forming the pseudo-post part 34 with metallic material, a construction may be adopted wherein the coil 100 is coated with an insulating coating in order to prevent the pseudo-post part 34 and the coil 100 from contacting.

As is apparent from the above description, with this embodiment the same effect as the for first embodiment can be obtained.

Furthermore, in this embodiment because the entire coil is covered by a magnetic body, the effective magnetic permeability around the coil is increased. Therefore the inductance of the coil can be increased more than in the first embodiment.

Fourth Embodiment

Figure 10:
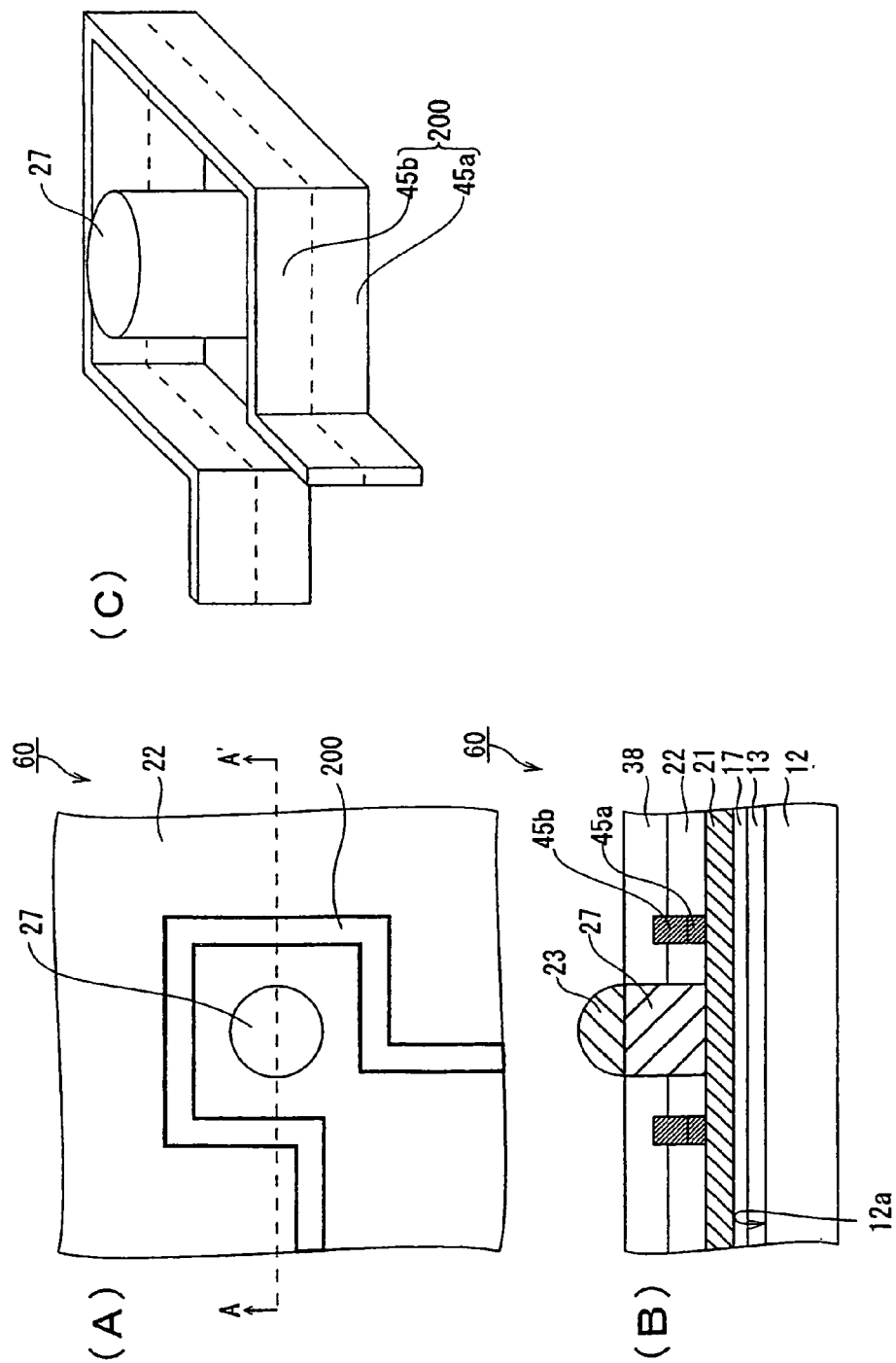
FIGS. 10(A) to 10(C) are diagrams accompanying a description of a semiconductor device of a fourth embodiment of this invention.
Figure 11:
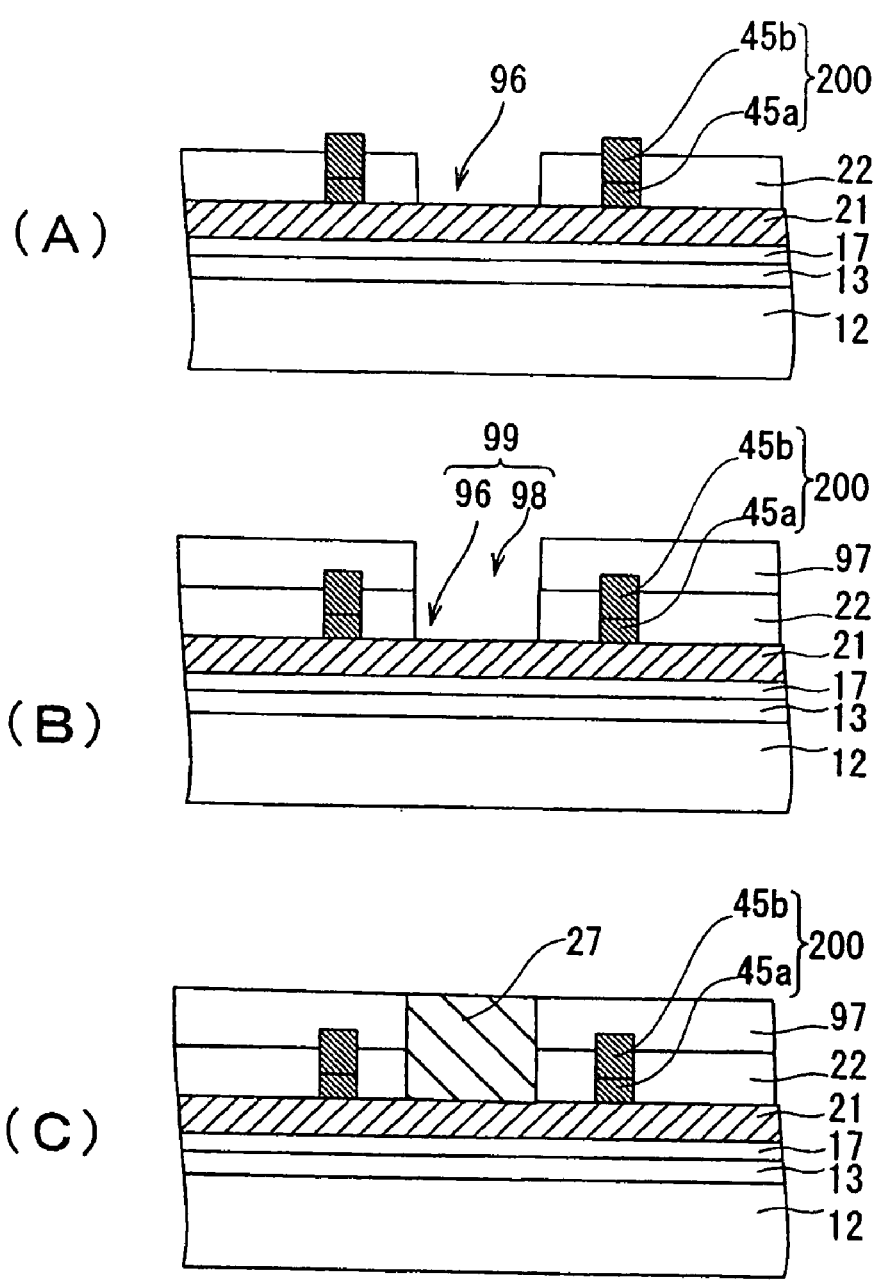
FIGS. 11(A) to 11(C) are diagram is accompanying the description of a production method for the semiconductor device of the fourth embodiment of this invention.
Figure 12:
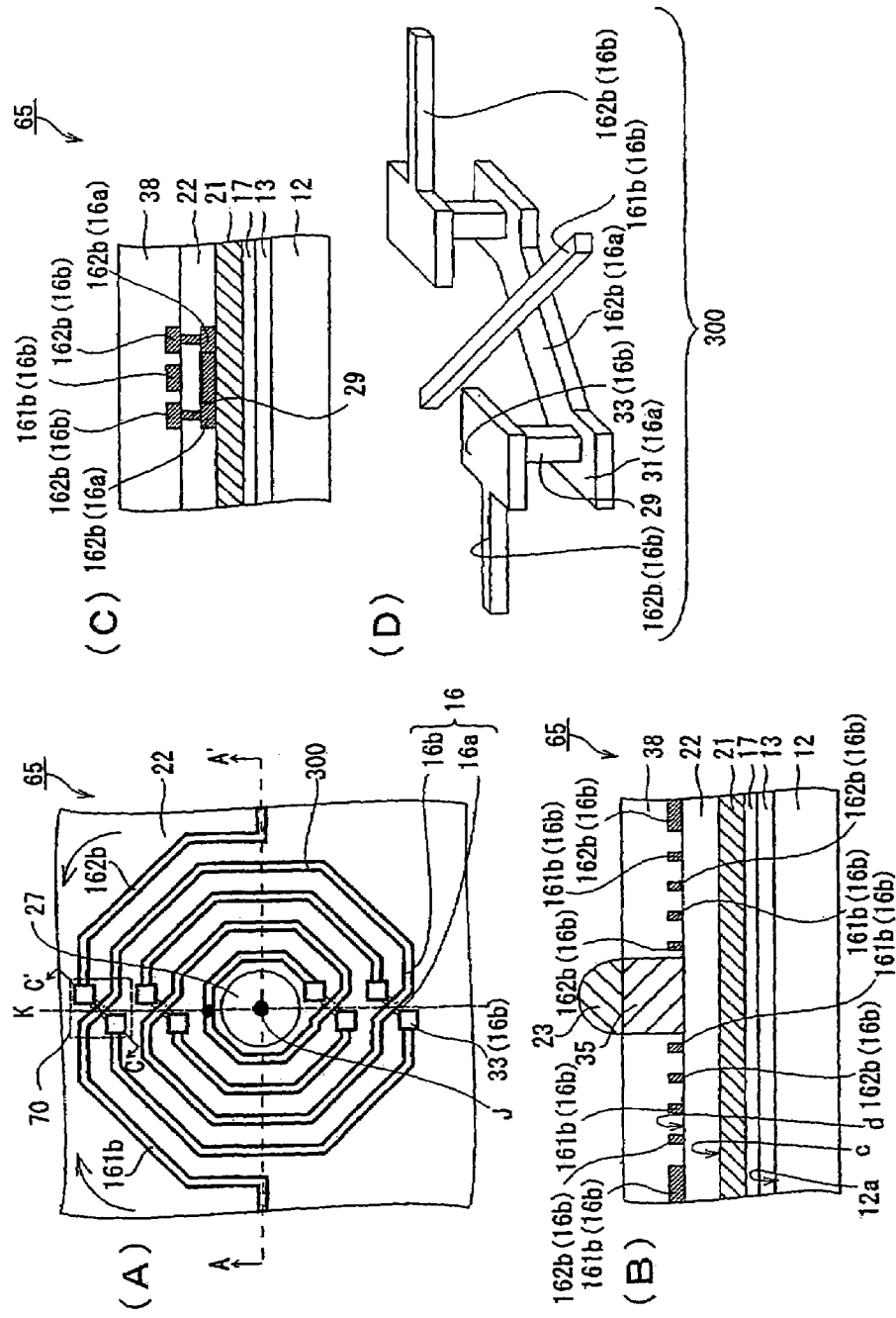
FIGS. 12(A) to 12(D) are diagrams accompanying a description of a semiconductor device of a fifth embodiment of this invention.

A semiconductor device according to a fourth embodiment of the present invention is described, with reference to FIG. 10 and FIG. 11. FIGS. 10(A), 10(B) and 10(C) are a simplified plan view, an A-A' cross sectional view, and a simplified perspective view showing one example of the position of the coil and the pseudo-post part, corresponding respectively to FIGS. 2(A), 2(B) and 2(C). In FIG. 10(A), the external terminal and the sealing layer shown in FIG. 10(B) are omitted.

The main point of difference between this embodiment and the first embodiment is that the thickness of the coil 200 is thicker than that of the first conductive part 15a (or the second conductive part 15b) of the first embodiment, that is, it is thicker than the first wiring layer 25a (or the second wiring layer 25b), and the pseudo post 27 is surrounded by board wall shaped (also called a belt or a ribbon shaped) conductive parts.

Specifically, as shown in FIG. 10(A) through (C), in a WCSP 60 of this embodiment, a frame shaped coil 200 is formed on the second insulating layer 21 at a position surrounding the pseudo-post part 27, by the upright board wall conductive parts. The coil 200 is described below.

The coil 200 has a construction wherein the first conductive part 45a and the second conductive part 45b are laminated. This is because, the conductive parts for the coil are formed by patterning at the same time as forming the rewiring layer of the WCSP described above, but the thickness of the conductive part which can be formed through a single conductive part forming process, is restricted by the thickness of the rewiring layer formed at this time.

Next, a production method for the WCSP 60 which is the semiconductor device of this embodiment is described hereunder, with reference to FIG. 11. FIG. 11(A) through (C) are production process diagrams focusing on the corresponding parts in FIG. 10(B).

Firstly, a first an insulating layer 13, a passivation layer 17 and the second insulating layer 21 are sequentially formed on the semiconductor chip 12. After that, by means of a photolithography process and sputtering and so forth, the first conductive part 45a and the second conductive part 45b which are made from copper are patterned in sequence on the second insulating layer 21, and the coil 200 is thus formed.

Specifically, when the first rewiring layer 25a described with reference to FIG. 2(D) in the first embodiment is formed, the first conductive part 45a is formed. Then, in the same way, when the second rewiring layer 25b is formed, the second conductive part 45b is formed on the first conductive part 45a. In this way, a thickness substantially the same as the laminated thickness of the first and second rewiring layers can easily be obtained.

Subsequently, a third insulating layer 22 is formed on the exposed second insulating layer 21. Then an aperture 96 for forming the pseudo-post part is formed by means of a photolithography process, so as to expose one part surrounded by the coil 200 on the surface of the second insulating layer 21 (FIG. 11(A)). Here if the coil 200 can be formed to have a thickness substantially the same as that of the laminated thickness of the first conductive part 45a and the second conductive part 45b, then this may be a single conductive part, or laminate having three or more layers, depending on the purpose and design.

Then, a dry film 97 having an aperture 98 is patterned on the third insulating layer 22 by means of a photolithography process, and an aperture 99 for forming a pseudo-post part 99 is formed (FIG. 11(B)).

Next, the aperture 99 is filled up with iron, which is a ferromagnetic material, by means of plating, and the pseudo-post part 27 is formed (FIG. 11(B)). After that, a sealing layer 38 and an external terminal 23 are formed in sequence (FIG. 10(B)).

As is apparent from the above description, with this embodiment the same effect as for the first embodiment can be obtained.

Furthermore, in this embodiment, the coil 200 has a thickness (that is, height) in a direction orthogonal to the main surface 12a of the semiconductor chip 12, that it is sufficiently thicker (that is, taller) than each of the conductive parts (15a and 15b) in the first embodiment.

As a result, because the wiring resistance of the coil can be made smaller than in the first embodiment, an even higher Q-value can be obtained.

Fifth Embodiment

A semiconductor device according to a fifth embodiment of the present invention is described, with reference to FIG.

Figure 13:
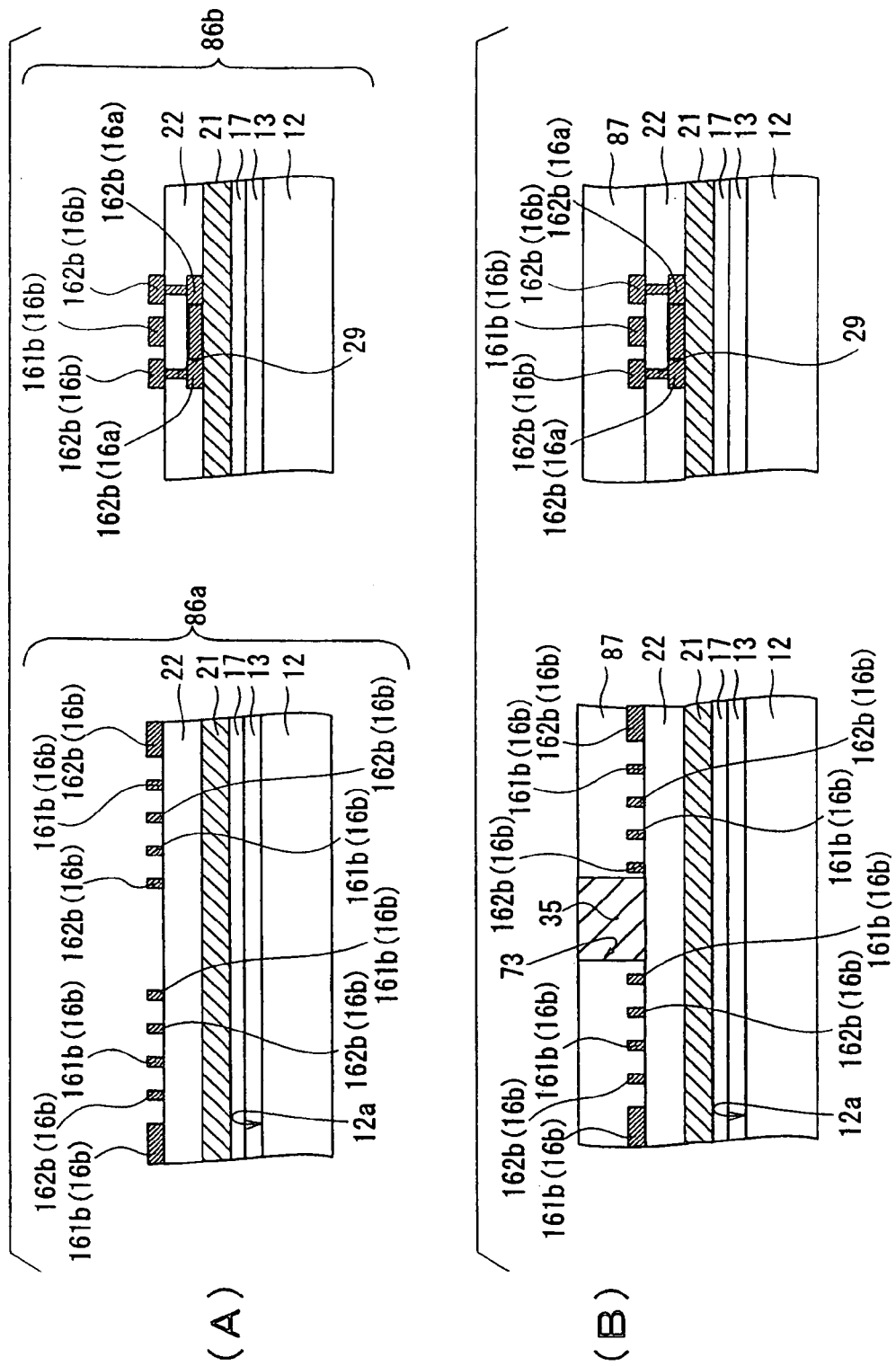
FIGS. 13(A) and 13(B) are diagrams accompanying a description of a production method for the semiconductor device of the fifth embodiment of this invention.

12 and FIG. 13. FIG. 12(A) is a diagram in which the coil formation area (the area corresponding to a first area enclosed by the broken line "a" in the plan view shown in FIG. 1), which is a principal part of this invention, is enlarged, showing the components in detail. FIG. 12(A) is shown with the external terminal and the sealing layer omitted. Furthermore, FIG. 12(B) is a simplified cross sectional view showing the cut face obtained by cutting FIG. 12(A) along the broken line A-A'. Also, FIG. 12(C) is a simplified cross sectional view showing the cut face obtained by cutting FIG. 12(A) along the broken line C-C'. FIGS. 12(B) and (C) are shown with the external terminal and the sealing layer not omitted.

As shown in FIG. 12(A) to FIG. 12(C), a WCSP 65, which is the semiconductor device of this embodiment, has a first insulating layer 13, a passivation coating 17, a second insulating layer 21, a third insulating layer 22 and a sealing layer 38 sequentially formed on the main surface 12a of a semiconductor chip 12.

In this embodiment a cylindrical pseudo-post part 35 comprising a magnetic body is formed on the third insulating layer 22 in the direction away from the semiconductor chip 12, that is, the direction orthogonal to the main surface 12a. The pseudo-post part 35 has its top end surface, that is its top face, exposed from the sealing layer 38, and is formed as the same surface with the top surface of the sealing layer 38. In other words the top end surface of the pseudo-post part 35 forms a continuous surface with the sealing layer 38. The pseudo-post part 27 of this configuration example is formed from iron, which is a ferromagnetic material.

Furthermore, a coil 300 is principally provided so that it surrounds the pseudo-post part 35 on the third insulating layer 22. When seen from a direction J, which is the central axis of the coil 300, (that is the direction orthogonal to the main surface 12a, that is the paper surface of FIG. 12(A)), the coil 300 is provided in a spiral shape that surrounds the central axis J, and has a shape that is substantially symmetrical about a virtual line K that is orthogonal to the central axis J. The coil 300 is described below.

The coil 300 is provided with a first spiral part 161b that winds in a spiral clockwise toward the central axis J and a second spiral part 162b that winds in a spiral counterclockwise toward the central axis J when seen from the direction of the central axis J. Also, the end parts of the first spiral part 161b and the second spiral part 162b on the central axis J side are both electrically connected at a connecting point L on the same plane.

Moreover, the coil 300 has a three-dimensional crossing part 70 including the parts where the first spiral part 161b and the second spiral part 162b cross and their surrounding areas. The appearance of this three-dimensional crossing part 70 is shown schematically in FIGS. 12(C) and (D) respectively. Here, a first plane "c" (FIG. 12(B)) parallel to the main surface 12a of the semiconductor chip 12 is taken as the top plane of the second insulating layer 21, and a second plane d is taken as the top plane of the third insulating layer 22. The first and second spiral parts (161b and 162b), which are everything of the coil 300 except for the three-dimensional crossing parts 70, are provided on the second plane d.

In the three-dimensional crossing part 70 one component part of one of either the first spiral part 161b or the second spiral part 162b is provided on the second plane d that is provided distant from the first plane c in the direction away from the semiconductor chip 12, that is the direction orthogonal to the main surface 12a, and the other part is provided on this first plane c. Therefore, in this configuration example, this first of the two component parts is constructed on the first conductive part 16a formed on the first plane c. Also, the remaining component parts of the first spiral part 161b and the second spiral part 162b which constitute the three-dimensional crossing part 70 are respectively constructed with the second conductive part 16b formed on the second plane d. The coil 300 is described in detail below.

In this configuration example, all of the first spiral part 161b is constituted by the second conductive parts 16b, which are formed on the third insulating layer 22, which is the second plane d.

On the other hand, the second spiral part 162b, except for the three-dimensional crossing part 70, is constituted by a plurality of the second conductive parts 16b formed on the third insulating layer 22. The second conductive parts 16b in the three-dimensional crossing part 70 are segmented. Also, lands 33 are respectively formed at both ends of each of these second conductive parts 16b.

Moreover, as shown in FIG. 12(D), on the second insulating layer 21 which is the first plane c, lands 31 comprising the first conductive part 16a are respectively formed in the positions opposing each of the lands 33 of the second spiral part 162b. When the semiconductor chip 12 is viewed from the direction orthogonal to the top surface 12a, the pair of lands 31 in each of the three-dimensional crossing parts 70 is connected by a linking part similarly comprising the first conductive part 16a. The first and second conductive parts (16a and 16b) are made from copper. In this way the lands (31 and 33) in opposing positions are electrically connected by the connection part 29 made from copper, and second spiral parts 162b are formed.

Specifically, the first spiral part 161b and the second spiral part 162b have a clearance in between in a substantially perpendicular direction to the main surface 12a in the three-dimensional crossing part 70, and each form spiral shapes. Also, in this configuration example, the second spiral part 162b has a construction having the segmented second conductive parts 16b as described above, however the first spiral part may also have such a construction. Furthermore, both the first spiral part 161b and the second spiral part 162b may also have segmented parts in this way.

When the coil has a spiral shape, by making the coil substantially symmetric about the hypothetical line K in this manner, the construction is such that regardless of which end of the coil the electric current flows in from, the mutual effect on the wiring that constitutes the coil is substantially equal As a result, because the inductance of the coil becomes substantially constant regardless of the direction of the electric current flowing through the coil, the WCSP 65 becomes stable, having a coil frequency characteristic that is not restricted by the direction of the electric current.

Next, a production method for the WCSP 65 which is the semiconductor device of this embodiment is described hereunder, with reference to FIG. 13. In FIGS. 13(A) and (B), the part corresponding to the cross section of FIG. 12(A) cut along the line A-A' is shown on the left side, and the part corresponding to the cross section of FIG. 12(A) cut along the line C-C' is shown alongside on the right.

Firstly, a first insulating layer 13, a passivation coating 17, and a second insulating layer 21 are sequentially formed on the main surface 12a of the semiconductor chip 12. After that, by means of a photolithography process and sputtering and so forth, the first conductive part 16a made from copper is formed on the second insulating layer 21. In this configuration example, a plurality of first conductive parts 16a are positioned in island form at predetermined intervals. At this point, the lands 31 are formed at both ends of each of the first conductive parts 16a. After that, the connection parts 29 made from copper are formed on each of the lands 31 at both ends of the first conductive parts 16a by means of a photolithography process and sputtering and so forth. Then the third insulating layer 22 is formed on the second insulating layer 21 to cover the sides of the connection parts 29 and expose their top faces. Next, the first spiral part 161b made from copper, and the second spiral part 162b having the lands 33 electrically connected to each connection part 29, are formed on the third insulating layer 22 by means of a photolithography process and sputtering and so forth.

In this way, the coil 300 which has a spiral shape surrounding the central axis J of the coil, and is substantially symmetrical about the hypothetical line K orthogonal to the central axis J, is formed (see FIG. 12(A)).

At this point, a first laminate 86a shown on the left side of FIG. 13(A) is formed in the part corresponding to the cross section of FIG. 12(A) cut along the line A-A'. Also, a first laminate 86b shown on the right side of FIG. 13(A) is formed in the part corresponding to the cross section of FIG. 12(A) cut along the line C-C'.

Subsequently, after a dry film 87 is coated and formed on the first and second laminates (86a and 86b), a part of the top surface of the third insulating layer 22 on the first laminate 86a side, is exposed in this dry film 87 by means of a photolithography process, and an aperture 73 for forming a pseudo-post part is thus formed. After that, the aperture 73 is filled up with iron, which is a ferromagnetic material, by means of a plating method, to form a pseudo-post part 35.

Then, after the dry film 87 is removed, epoxy resin which serves as the sealing layer 38 is formed to the extent that it covers the pseudo-post part 35, and an external terminal 23 is formed by reflowing, on the exposed top end surface of pseudo-post part 35 (FIG. 12(B)).

As is apparent from the above description, with this embodiment, the same effect as for the first embodiment can be obtained.

Furthermore, in this embodiment, because the inductance of the coil becomes substantially constant regardless of the direction of the electric current flowing through the coil, a stable WCSP having a coil frequency characteristic which is not restricted by the direction of the electric current can be obtained.

Sixth Embodiment

A semiconductor device according to a sixth embodiment of the present invention is described with reference to FIG. 14 and FIG. 15.

FIG. 14(A) is a diagram in which the coil formation area, (the area corresponding to the first area enclosed by the broken line "a" in the plan view shown in FIG. 1), which is a principal part of this invention, is enlarged showing each of the components in detail. FIG. 14(A) is shown with the external terminal and the sealing layer omitted. Furthermore, FIG. 14(B) is a simplified view showing the cut face obtained by cutting FIG. 14(A) along the broken line A-A'. FIG. 14(B) is shown with the external terminal and the sealing layer not omitted. Also, FIG. 14(C) is a simplified cross sectional view showing the cut face obtained by cutting FIG. 14(A) along the broken line D-D'.

This embodiment differs from the fifth embodiment principally in that a first spiral part 190a that winds in a spiral clockwise toward the central axis J and a second spiral part 190b that winds in a spiral counterclockwise toward the central axis J are respectively formed on different planes.

Figure 14:
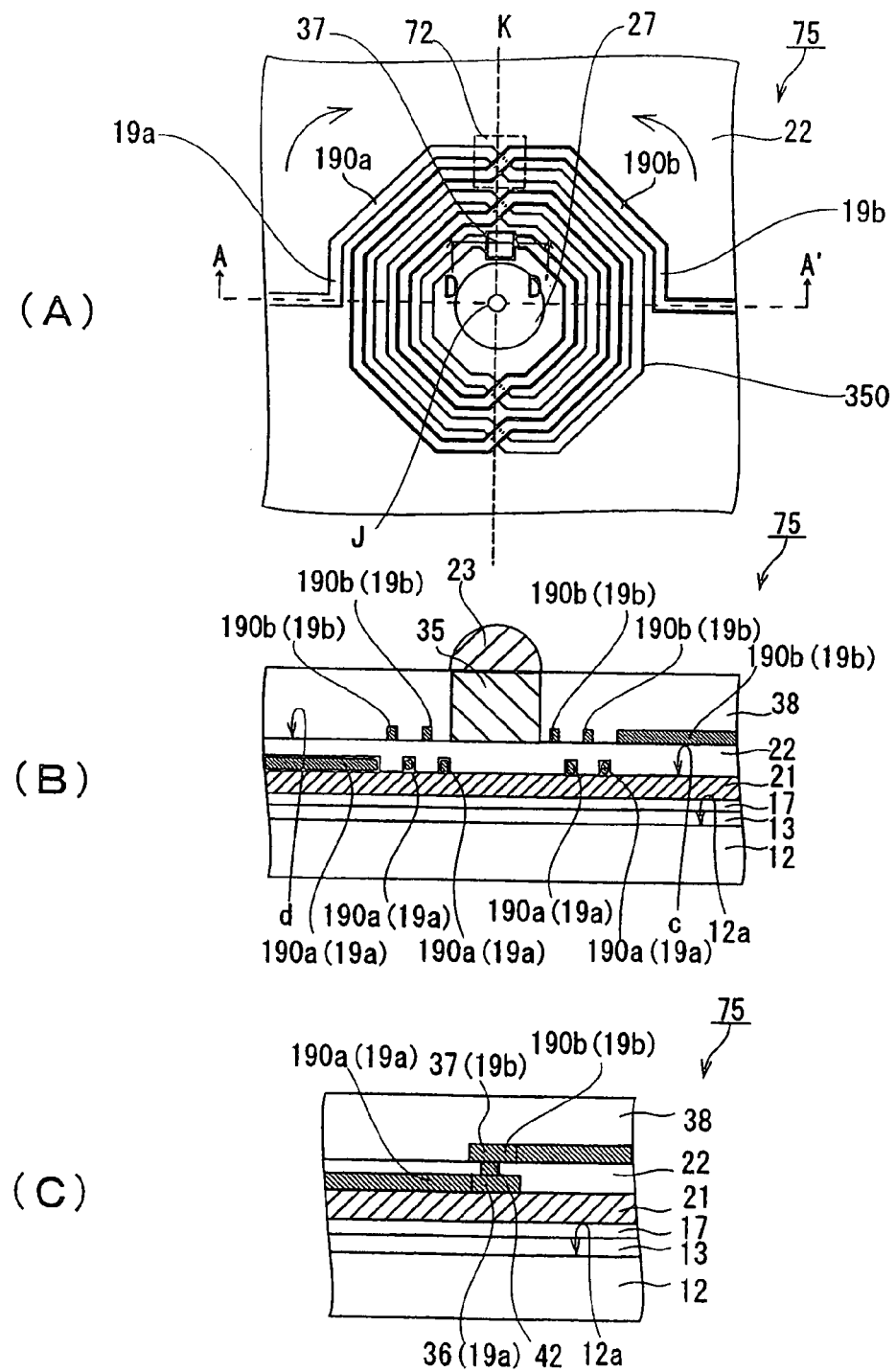
FIGS. 14(A) to 14(C) are diagrams accompanying a description of a semiconductor device of a sixth embodiment of this invention.

Specifically, as shown in FIG. 14, in the WCSP 75, which is the semiconductor device of this embodiment, when the wiring constituting the coil 350 is seen from the direction of the central axis J in as with the fifth embodiment, this has a first spiral part 190a winding in a spiral clockwise toward the central axis J and a second spiral part 190b winding in a spiral counterclockwise toward the central axis J.

In this embodiment, the coil 350 is formed separately on a first plane c and a second plane d that are separated from each other in the direction away from the semiconductor chip 12, that is, the direction perpendicular to the main surface 12a. In this configuration example, the first plane c is taken as the top plane of the second insulating layer 21, and the second plane is taken as the top plane of the third insulating layer 22. A first conductive part 19a which is a first spiral part 190a that constitutes the coil 350 is formed on the first plane c. Also, a second conductive part 19b which is another second spiral part 190b that constitutes the coil 350 is formed on the second plane d. The coil 350 is described in detail below.

The first and second conductive parts (19a and 19b) are made from copper. Also, the end parts of the first spiral part 190a and the second spiral part 190b on the central axis J side, that is, the lands (36 and 37), are electrically connected via a connection part 42 that is made from copper.

In the three-dimensional crossing part 72 which is the area including, the part where the first spiral part 190a and the second spiral part 190b cross, and the surrounding area, the first spiral part 190a and the second spiral part 190b cross and are separated from each other in a direction substantially orthogonal to the main surface 12a of the semiconductor chip 12.

Figure 15:
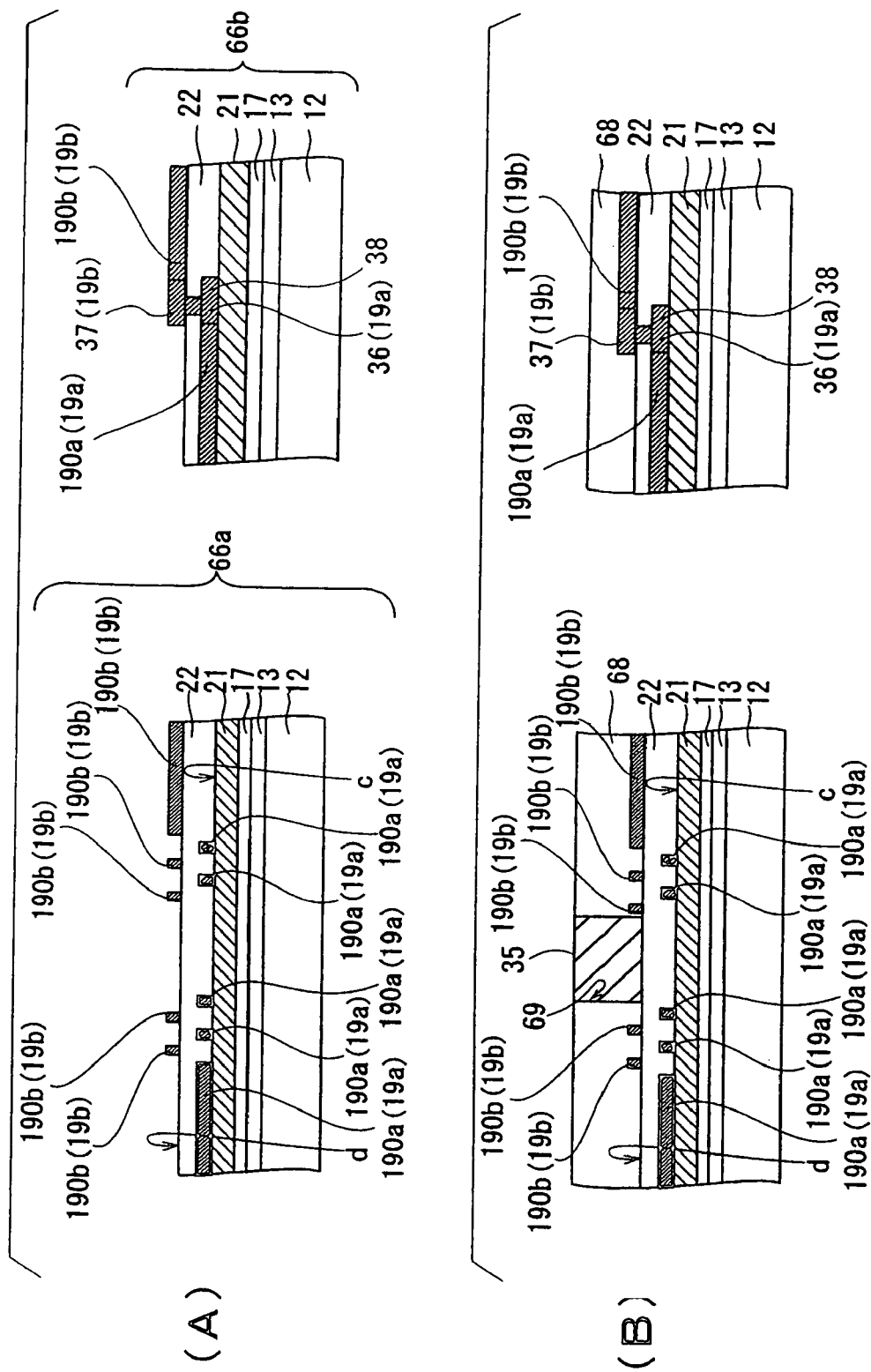
FIGS. 15(A) and 15(B) are diagrams accompanying a description of a production method for the semiconductor device of the sixth embodiment of this invention.

Next, a production method for the WCSP 75 which is the semiconductor device of this embodiment is described hereunder, with reference to FIG. 15. In the drawings, the part corresponding to the cross section of FIG. 14 (A) cut along the line A-A' is shown on the left side and the part corresponding to the cross section of FIG. 14(A) cut along the line D-D' is shown together on the right side.

Firstly, a first insulating layer 13, a passivation coating 17 and a second insulating layer 21 are sequentially formed on the main surface 12a of the semiconductor chip 12. After that, by means of a photolithography process and sputtering and so forth, the first conductive part 19a made from copper is formed as the first spiral part 190a of a clockwise spiral shape, on the second insulating layer 21. At this point, the land 36 is formed at the end part of the first conductive part 19a on the side corresponding to the central axis. After that, the connection part 42 made from copper is formed on the land 36 of the spiral of the first conductive part 19a by means of a photolithography process, plating and so forth. Then the third insulating layer 22 is formed on the second insulating layer 21 to cover the sides of the connection part 42 and expose its top face (FIG. 15(A) on right). Next, the second conductive part 19b made from copper is formed as the second spiral part 190b of a counterclockwise spiral shape and has the land 37 electrically connected to the connection part 42, on the third insulating layer 22, by means of a photolithography process and sputtering and so forth.

In this way, the coil 350 which has a spiral shape surrounding the central axis J of the coil, and is substantially symmetrical about the hypothetical line K orthogonal to the central axis J, is formed.

At this point, a first laminate 66a shown on the left side of FIG. 15(A) is formed in the part corresponding to the cross section of FIG. 14(A) cut along the line A-A'. Also, a second laminate 66b shown on the right side of FIG. 15(A) is formed in the part corresponding to the cross section of FIG. 14(A) cut along the line D-D'.

Subsequently, after a dry film 68 is coated and formed on the first and second laminates (66a and 66b), a part of the top surface of the second insulating layer 21 on the first laminate 66a side, is exposed by means of a photolithography process, and an aperture 69 for forming a pseudo-post part is thus formed. After that, the aperture 69 is filled up with iron which is a ferromagnetic material by means of a plating method, to form a pseudo-post part 35 (FIG. 15(B)). Then, the sealing layer 38 and the external terminal 23 are sequentially formed (FIG. 14(B)).

As is apparent from the above description, with this embodiment, the same effect as for the fifth embodiment can be obtained.

Furthermore, in this embodiment the construction is one in which the first spiral part and the second spiral part are electrically connected via a pair of lands opposing each other. Therefore, the area occupied by the coil can be reduced, compared to the construction of the fifth embodiment which requires a plurality of pairs of lands.

Also, because it does not require the patterning of a plurality of conductive parts in island form as the fifth embodiment does, high patterning accuracy is not required when forming the first conductive part and second conductive part. Therefore, concerns with regard to production yield are eased compared to the fifth embodiment.

Seventh Embodiment

Figure 16:
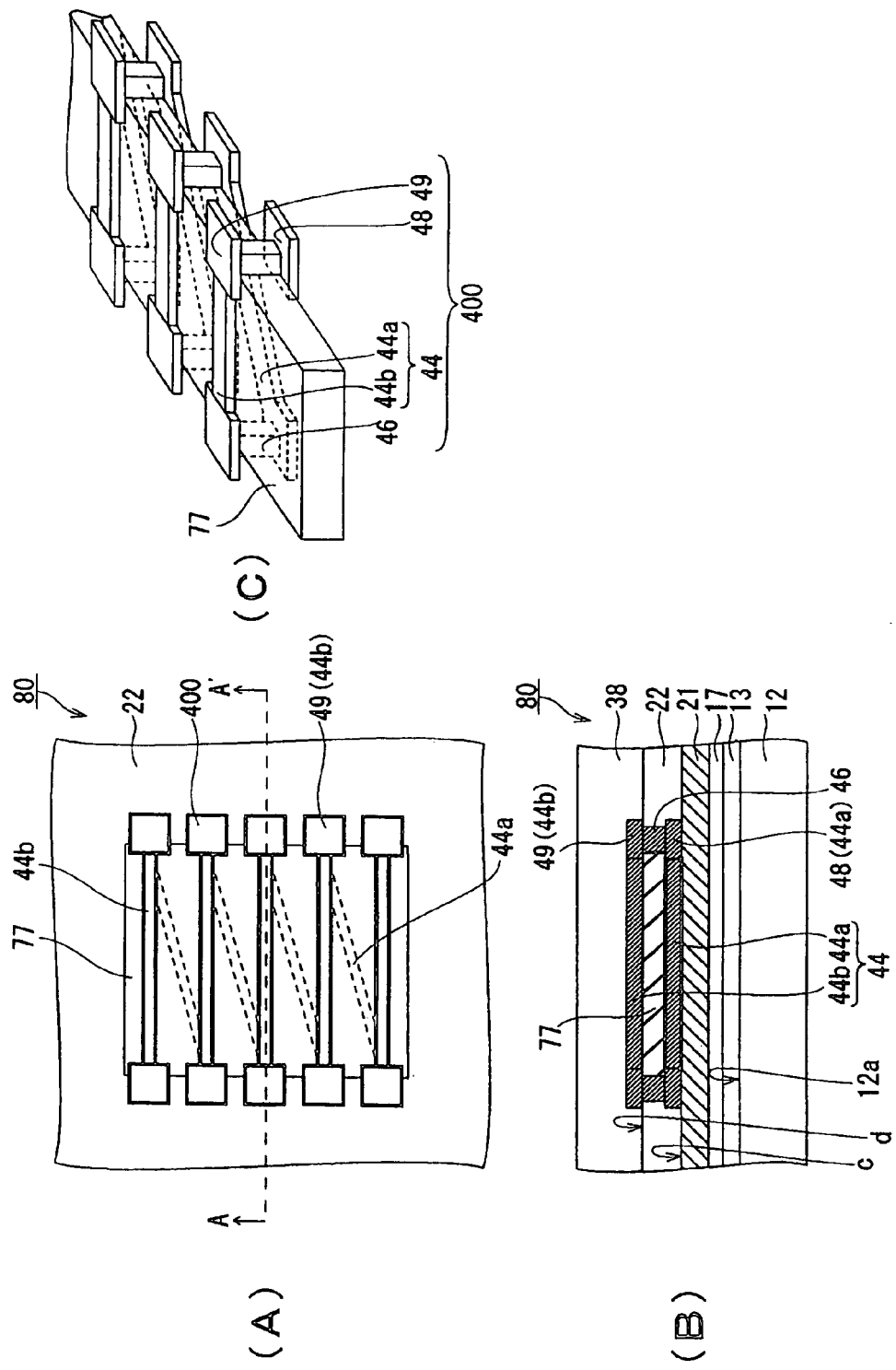
FIGS. 16(A) to 16(C) are cross sectional views accompanying a description of a semiconductor device of a seventh embodiment of this invention.
Figure 17:
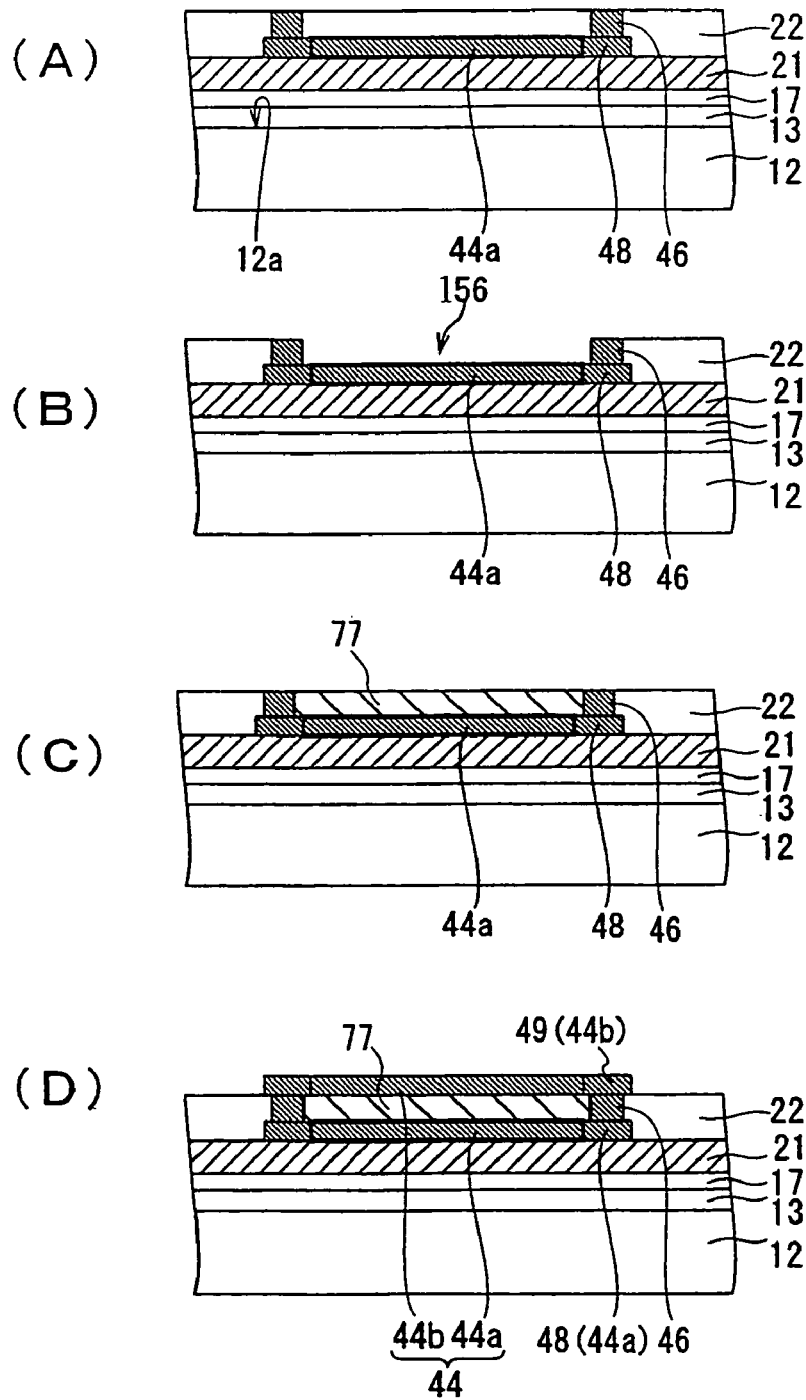
FIGS. 17(A) to 17(D) are diagrams accompanying a description of a production method for the semiconductor device of the seventh embodiment of this invention.

A semiconductor device according to a seventh embodiment of this invention is described, with reference to FIG. 16 and FIG. 17. FIG. 16(A) is a diagram in which the coil formation area (the area corresponding to the first area enclosed by the broken line "a" in the plan view shown in FIG. 1), which is a principal part of this invention, is enlarged showing each of the components in detail. FIG. 16(A) is shown with the sealing layer 38 omitted. Furthermore, FIG. 16(B) is a simplified view showing the cut face obtained by cutting FIG. 16(A) along the broken line A-A'. FIG. 16(B) is shown with the sealing layer 38 not omitted. Also, FIG. 16(C) is a simplified perspective view showing the positional relationship of a coil 400 and a magnetic core part 77 comprising a magnetic body.

As shown in FIGS. 16(A) and (B), a WCSP 80, which is the semiconductor device of this embodiment, has a substantially prismatic or tabular magnetic core part 77 comprising a magnetic body. This magnetic core part 77 extends along the main surface 12a, that is in parallel with the main surface 12a, on the second insulating layer 21, and is covered with a sealing layer 38.

Also, a coil 400 is provided to surround the magnetic core part 77. Furthermore, this coil 400 forms a substantially spiral shaped conducting path along the extension direction of the magnetic core part 77 and in parallel with the main surface 12a. The coil 400 is described below.

The coil 400 has a conductive part 44 that has a first conductive part 44a and a second conductive part 44b, lands 44 and 49, and a connection part 46. The first and second conductive parts. (44a and 44b) of the coil 400 are provided to be hierarchically separated on a first plane c and a second plane d which are separated from each other in the direction perpendicular to the main surface 12a of the semiconductor chip. These first and second planes, c and d, are parallel with the main surface 12. In this embodiment, the first plane c is taken as the top side of the second insulating layer 21, and the second plane d is taken as the top side of the third insulating layer 22. Furthermore, these first and second conductive parts (44a and 44b) are provided in a position sandwiching the magnetic core 77 from above and below respectively.

Specifically, as shown in FIG. 16(A) through (C), the first conductive parts 44a extend in the longitudinal direction of the magnetic core part 77, that is, a direction which crosses diagonal to the longitudinal direction, between the second insulating layer 21 and the magnetic core part 77. A plurality of these first conductive parts 44a are positioned at predetermined intervals in the longitudinal direction of the magnetic core part 77.

Also, the second conductive parts 44b lie between the sealing layer 38 and the magnetic core part 77 in a direction orthogonal to the longitudinal direction of the magnetic core part 77. A plurality of these second conductive parts 44b are positioned at predetermined intervals in the longitudinal direction of the magnetic core part 77.

Also, lands 48 are provided at both ends of the first conductive parts 44a, and lands 49 are provided at both ends of the second conductive parts 44b, and the lands 48 and 49 are provided in a position in which they substantially overlap one another in the vertical direction. Furthermore, connection parts 46 pass completely through the third insulating layer 22 between the opposing lands 48 and 49.

As a result, the coil 400 forms a substantially spiral conductive part having the conductive part 44 comprising the first conductive part 44a and the second conductive part 44b, the lands 48 and 49, and the connection part 46 integrally connected.

The first and second conductive parts (44a and 44b) here are formed from copper.

Also, because the magnetic core part 77 of this embodiment is formed from insulating material such as ferrite, there is no concern of the coil 400 short-circuiting.

Next, a production method for a WCSP 80 which is the semiconductor device of this embodiment is described hereunder, with reference to FIG. 17.

Firstly, a first insulating layer 13, a passivation coating 17, and a second insulating layer 21 are sequentially formed on the main surface 12a of the semiconductor chip 12. After that, the first conductive parts 44a made from copper are formed on the second insulating layer 21 by means of a photolithography process, spattering and so forth. In this configuration example, the first conductive parts 44a with the lands 48 attached are made to cross with the extension direction of the magnetic core part 77, which is to be formed in a later process, and a plurality of these are formed at predetermined intervals in the extension direction of the magnetic core part 77. After that, the connection parts 46 made from copper are formed on the lands 48 at both ends of each first conductive part 44a by means of a photolithography process and plating and so forth. Then, a third insulating layer 22 to cover the sides of the connection parts 46 and expose their top faces is formed on the second insulating layer 21 (FIG. 17(A)).

Next, an aperture 156 for forming a magnetic core part of a depth that exposes the top surface of the first conductive part 44a from the top surface of the third insulating layer 22 is formed by means of a photolithography process (FIG. 17(B)). This aperture 156 is provided in an area between one series of connection parts comprising a series of the connection parts 46 provided corresponding to one end of the first conductive parts 44a, and a series of connection parts comprising a series of the connection parts 46 provided corresponding to the other end parts. In this embodiment, both series of connection parts are respectively substantially linear and are substantially parallel with each other.

Next, a polyimide containing ferrite, which is a ferromagnetic material, is coated on the aperture 156 for formation of a magnetic core. Then the magnetic core part 77 is formed by curing the polyimide by means of heat treatment (FIG.

17(C)). The top surface of the magnetic core part 77 and the top surface of the third insulating layer 22 are at the same level.

Next, the second conductive parts 44b, which are made from copper and have the lands 49 which are electrically connected to the connection parts 46, are formed over the top of the third insulating layer 22 by means of a photolithography process and sputtering and so forth (FIG. 17(D)). After that, the sealing layer 38 is formed (FIG. 16(B)).

As is apparent from the description above, with this embodiment, the same effect as for the first embodiment can be obtained.

Eighth Embodiment

Figure 18:
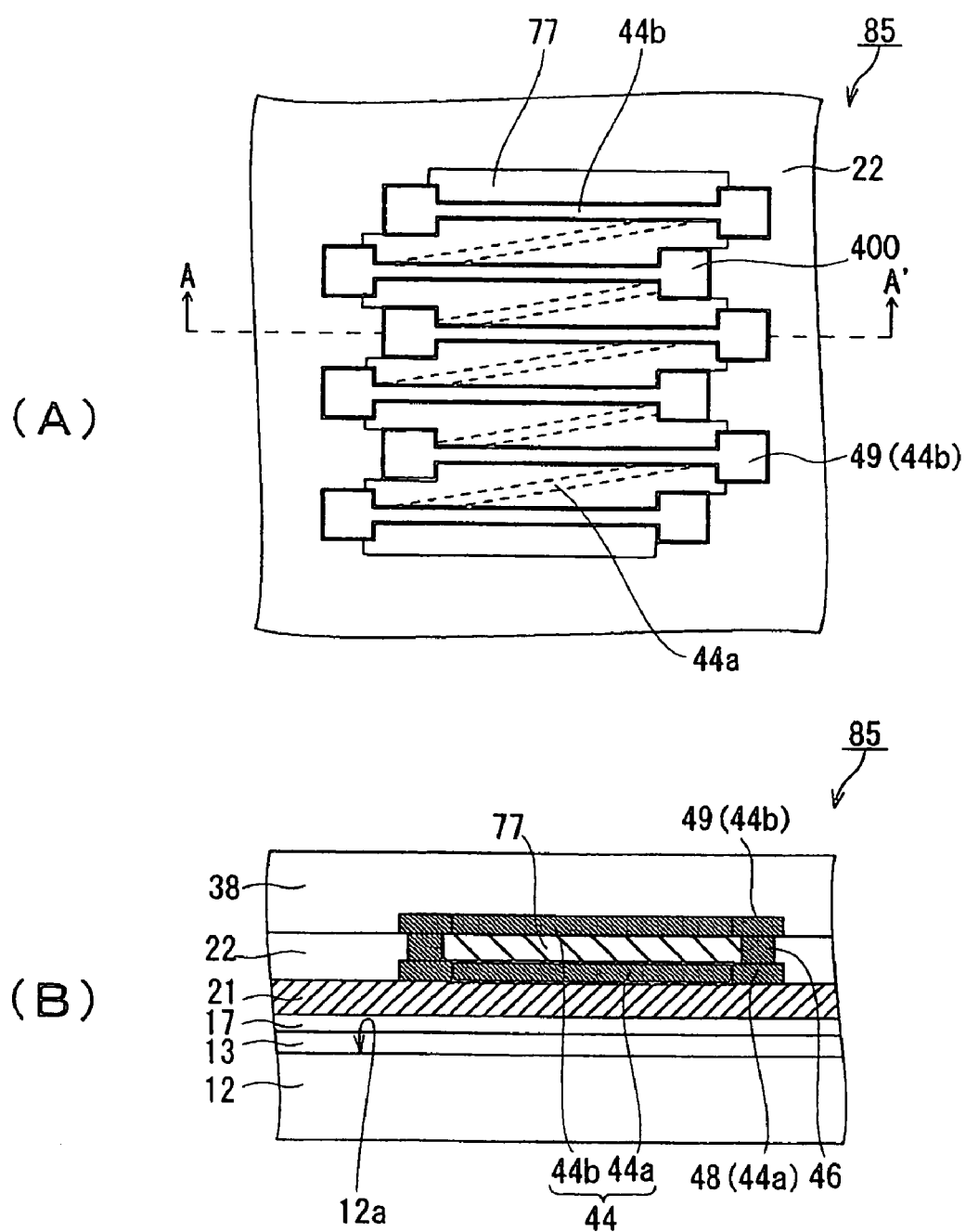
FIGS. 18(A) and 18(B) are cross sectional views accompanying a description of a semiconductor device of an eighth embodiment of this invention.

A semiconductor device according to an eighth embodiment of this invention is described, with reference to FIG. 18. FIGS. 18(A) and (B) are a simplified plan view and a diagram showing a cross section on A-A', respectively corresponding to FIGS. 2(A) and (B). FIG. 18(A) shows a sealing layer 38 omitted, and FIG. 18(B) shows the sealing layer 38 not omitted.

This embodiment differs from the seventh embodiment principally in that the array of connection parts 46 is provided in a zigzag configuration.

Specifically, as shown in FIGS. 18(A) and (B), in a WCSP 85 which is the semiconductor device of this embodiment, a plurality of connection parts 46 are arranged along the extension direction of a magnetic core part 77 comprising a magnetic body, and cross that extension direction, and are formed alternately in the direction which is parallel to the main surface 12a of a semiconductor chip 12.

The production method for the WCSP 85 which is the semiconductor device of this embodiment can be realized by forming each of the connection parts 46 of each arrayed series in the seventh embodiment so that they alternate respectively, and a detailed description thereof is omitted here. In this case, the connection part 46 of the magnetic core part 77 and a corresponding side end part are convexo-concave.

As is apparent from the description above, with this embodiment, the same effect as for the first embodiment can be obtained.

Moreover, in this embodiment, because the connection part is formed interchangeably as described above, the pitch of the coil becomes smaller than in the seventh embodiment. Therefore a WCSP having an area occupied by the coil reduced even further can be obtained.

Ninth Embodiment

A semiconductor device according to a ninth embodiment of this invention is described with reference to FIG. 19 and FIG. 20. FIG. 19(A) and FIG. 19(B) are a simplified plan view and a diagram showing a cross section cut along the line A-A', respectively corresponding to FIG. 2(A) and FIG. 2(B). FIG. 19(A) shows a sealing layer 38 omitted in FIG. 19(A), and FIG. 19(B) shows the sealing layer 38 not omitted.

This embodiment differs from the seventh embodiment principally in that the coil 400 is embedded in a magnetic core part 78 made of insulating material.

Specifically, as shown in FIGS. 19(A) and (B), the magnetic core part 78 is formed so as to embed the coil 400, on a second insulating layer 21 of a WCSP 90 of this embodiment. Because the magnetic core part 78 of this embodiment is formed with insulating material such as ferrite, there is no concern of the coil 400 short-circuiting.

Figure 20:
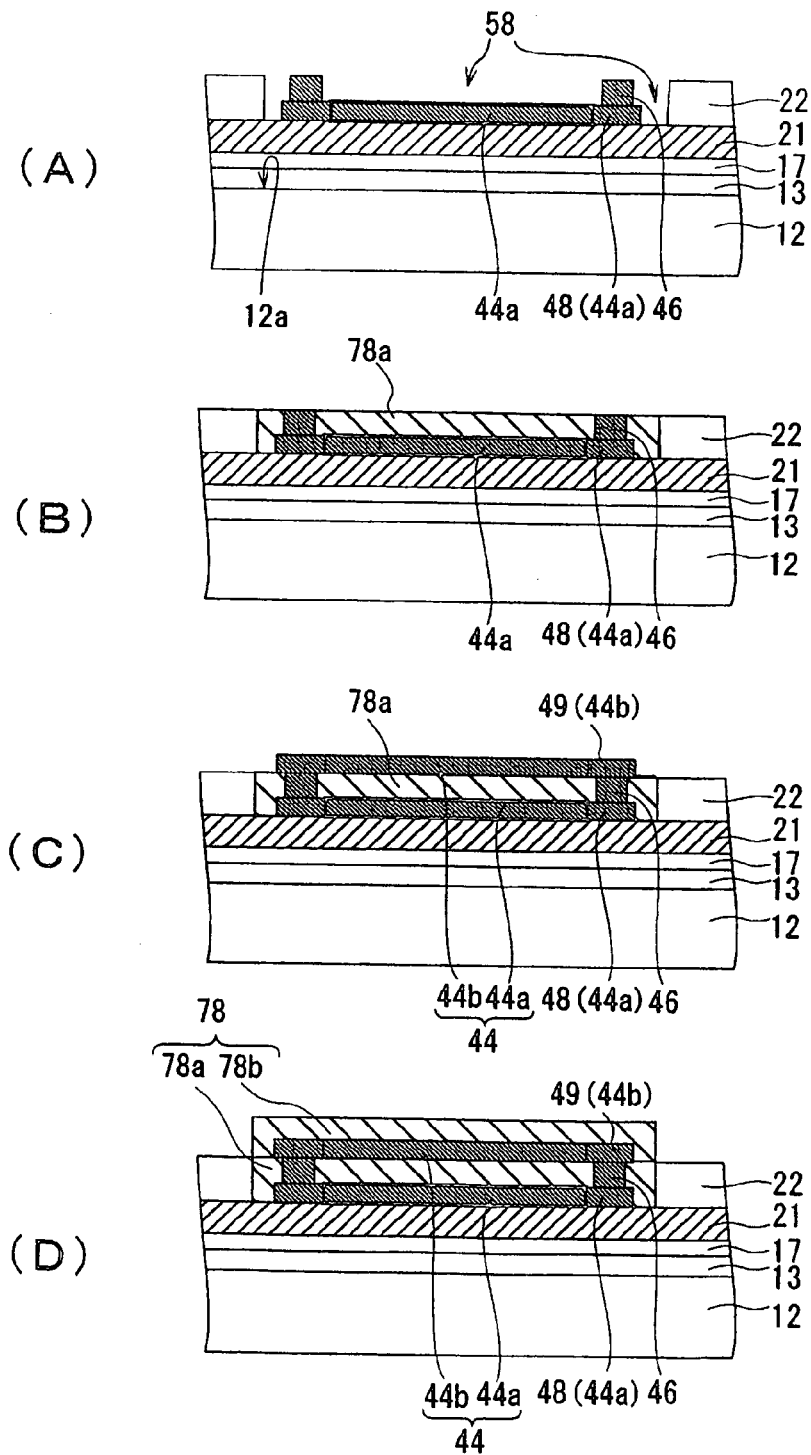
FIGS. 20(A) to 20(D) are diagrams accompanying a description of a production method for the semiconductor device of the ninth embodiment of this invention.

Next, a production method for the WCSP 90 of this embodiment, is described hereunder, with reference to FIG. 20.

Firstly, the formation up to a third insulating layer 22 on the main surface 12a of a semiconductor chip 12 is carried out by the same method as for the seventh embodiment (see FIG. 17(A)).

Next, an aperture 58 for forming a magnetic core is formed on the third insulating layer 22 (FIG. 20(A)). This aperture 58 is formed so as to expose the top surface of an assembly of first conductive parts 44a formed on a second insulating layer 21, lands 48 and connection parts 46. Therefore, it can be opened to a depth in which the top surface of the second insulating layer 21 is exposed, leaving the assembly surrounded from the outside by, and contained within an area of, the third insulating layer 22.

Then, after a coating of polyimide containing ferrite, which is a ferromagnetic material, is applied to the aperture 58 for forming a magnetic core part, a first magnetic core part 78a is formed by curing the polyimide by means of heat treatment. At this point, the top end face, that is the top face of the connection part 46 is exposed out of the first magnetic core part 78a (FIG. 20(B)).

Next, second conductive parts 44b that are made from copper and have lands 49 electrically connected to the connection parts 46 are formed on the first magnetic core part 78a by means of a photolithography process and sputtering and so forth (FIG. 20(C)).

Then, a resist layer (not shown) covering the third insulating layer 22 is formed by means of a photolithography process on this layer 22. After that, a second magnetic core part 78b is formed so as to embed the second conductive part 44b exposed out of the resist layer. After a coating of a polyimide containing ferrite is applied, the second magnetic core part 78b is formed by curing the polyimide by means of heat treatment. After that, the resist layer is removed, and the magnetic core part 78 comprising the first magnetic core part 78a and the second magnetic core part 78b is formed (FIG. 20(D)). Then, a sealing layer 38 is formed to cover the second magnetic core part 78b. (FIG. 19(B)).

As is apparent from the description above, with this embodiment, the same effect as for the first embodiment can be obtained.

Furthermore, in this embodiment, because the entire coil is covered with a magnetic body, effective magnetic permeability around the coil is greater. Therefore, the coil inductance can be increased further than for the seventh embodiment.

Tenth Embodiment

Figure 21:
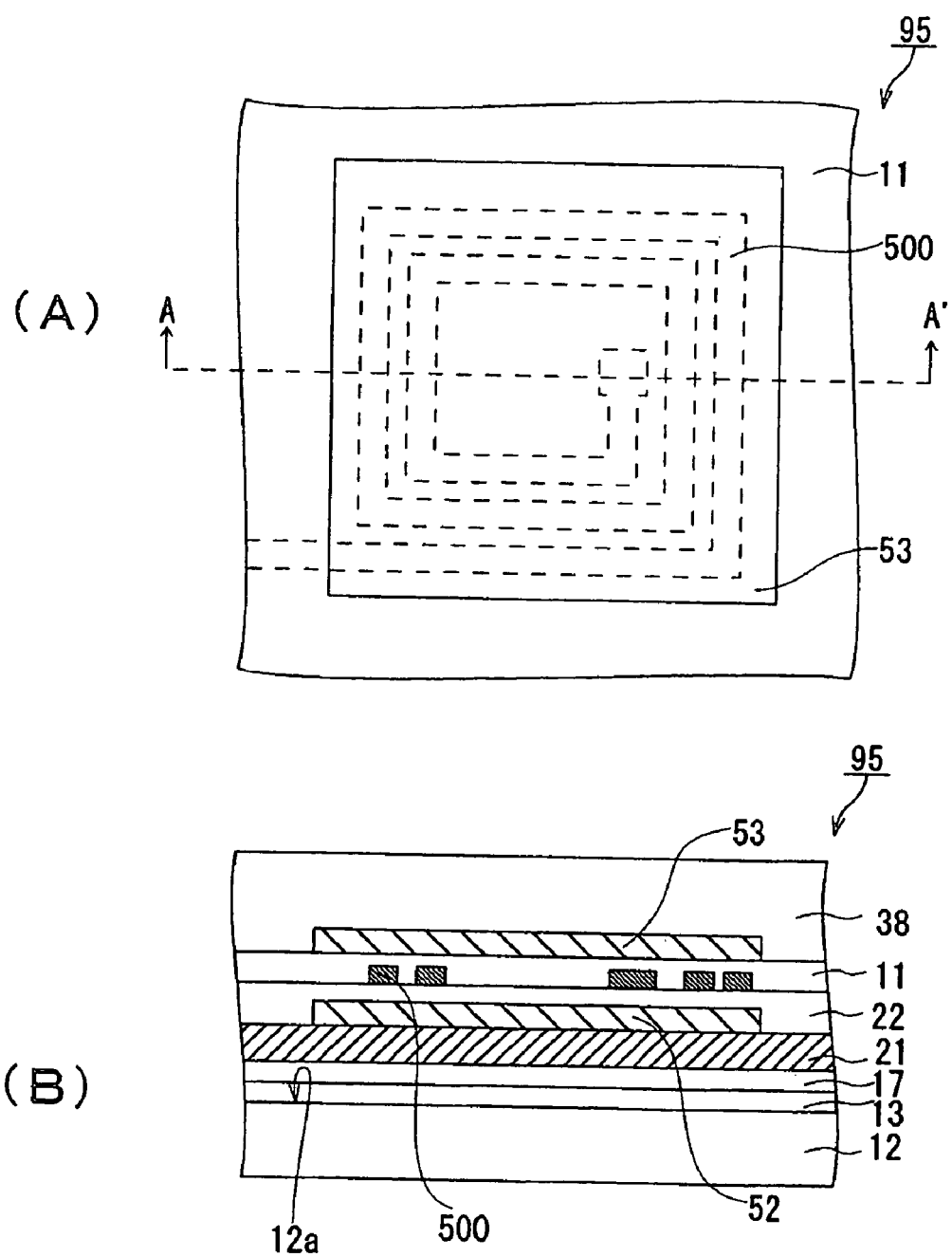
FIGS. 21(A) and 21(B) are diagrams accompanying a description of a semiconductor device of a tenth embodiment of this invention.

A semiconductor device according to a tenth embodiment of this invention is described with reference to FIG. 21 and FIG. 22. FIG. 21(A) is a diagram in which the coil formation area (the area corresponding to the first area surrounded by the broken line "a" in the plan view shown in FIG. 1), which is a principal part of the present invention, is enlarged showing each of the components in detail. Also, FIG. 21(B) is a simplified diagram showing the cut face obtained by cutting FIG. 21(A) along the line A-A'. FIG. 21(A) is shown with a sealing layer 38 omitted, and FIG. 21(B) is shown with the sealing layer 38 is not omitted.

As shown in FIGS. 20(A) and (B), a WCSP 95 which is the semiconductor device of this embodiment has a first insulating layer 13, a passivation coating 17, a second insulating layer 21, a third insulating layer 22, a fourth insulating layer 11 and a sealing layer 38 sequentially formed on the main surface 12a of a semiconductor chip 12.

Moreover, in this embodiment, a tabular first magnetic layer 52 and second magnetic layer 53 are formed opposing each other on the second insulating layer 21 and the fourth insulating layer 11 respectively. The first and second magnetic layers (52 and 53) of this configuration example are quadrilateral and formed from iron, which is a ferromagnetic material.

Also, a coil 500 is formed in a spiral shape in a position in the area sandwiched between the first magnetic layer 52 and the second magnetic layer 53, and on the third insulating layer 22. In this configuration example, the shape of the coil 500 is a quadrilateral spiral.

Figure 22:
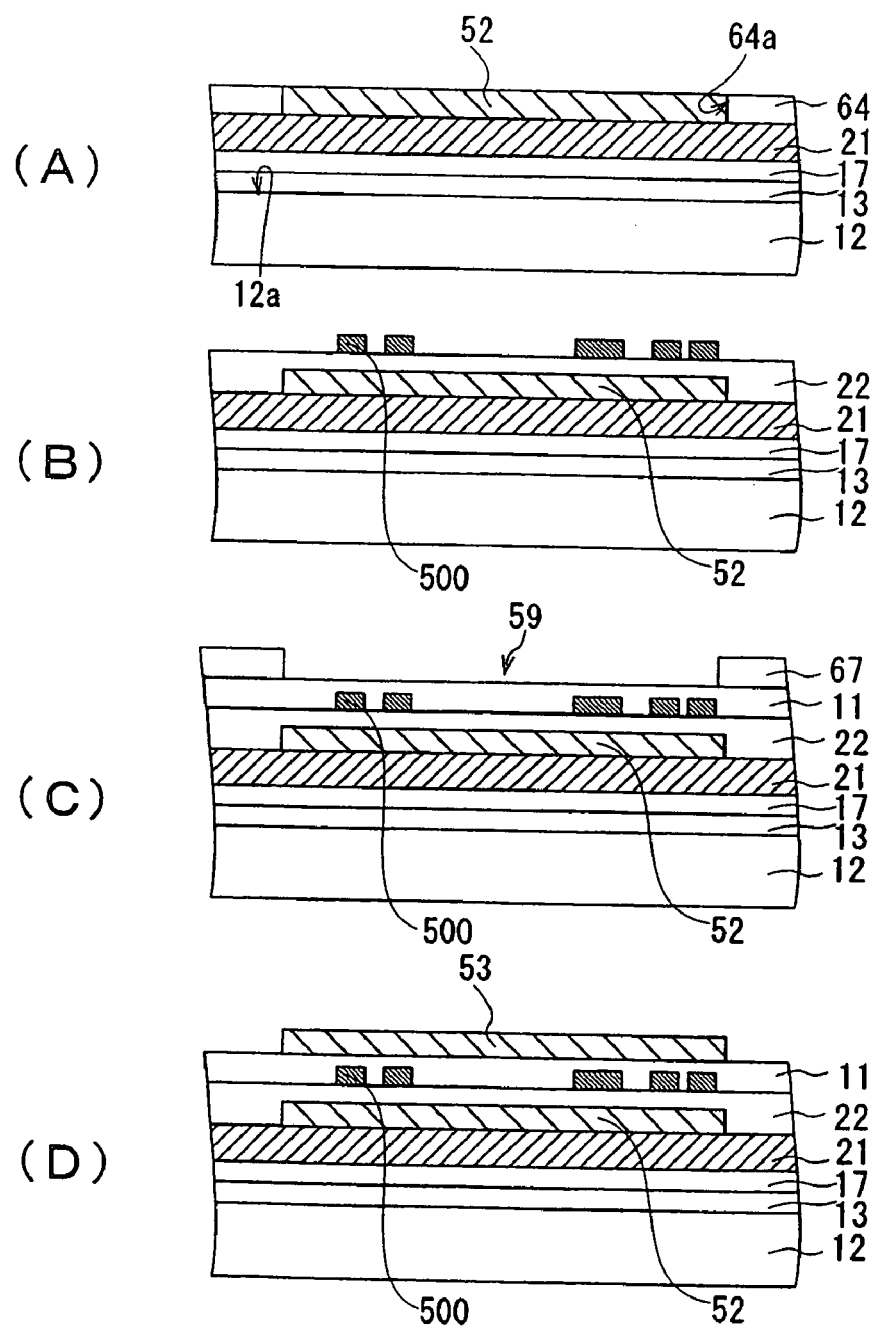
FIGS. 22(A) to 22(D) are diagrams accompanying a description of a production method for the semiconductor device of the tenth embodiment of this invention.

Next, a production method for the WCSP 95 which is the semiconductor device of this embodiment is described hereunder, with reference to FIG. 22.

Firstly, a first insulating layer 13, a passivation coating 17 and a second insulating layer 21 are sequentially formed on the main surface 12a of a semiconductor chip 12. Then, after a resist layer 64 is formed on the second insulating layer 21, a first aperture 64a for forming a magnetic layer that exposes part of the top surface of the second insulating layer 21 is formed by means of a photolithography process. After that, this aperture 64a is filled up with iron, which is a ferromagnetic material, by means of a plating method, to thereby form a tabular magnetic layer 52 (FIG. 22(A)).

Next, after the resist layer 64 is removed, a third insulating layer 22 is formed on the second insulating layer 21 so as to embed the first magnetic layer 52. After that, the spiral shaped coil 500 made from copper is formed on the third insulating layer 22 by means of a photolithography process and sputtering and so forth (FIG. 22(B)).

Next, a fourth insulating layer 11 is formed on the third insulating layer 22 so as to embed the coil 500. Then, after a resist layer 67 is formed on the fourth insulating layer 11, an aperture 59 for forming a second magnetic layer, which exposes part of the top surface of the fourth insulating layer 11, is formed by means of a photolithography process (FIG. 22(C)).

After that, the aperture 59 for forming the second magnetic layer is filled up with iron, which is a ferromagnetic material, by means of a plating method to thereby form a tabular magnetic layer 53. At this point, it is preferable to arrange the second magnetic layer 53 and the first magnetic layer 52 to face each other squarely. After that, the resist layer 67 is removed (FIG. 22(D)). Then, a sealing layer 38 is formed (FIG. 21(B)).

As is apparent from the description above, this embodiment allows the inductance of the coil to be increased by having the magnetic bodies sandwiching the coil from above and below. In this embodiment the construction is such that the coil is sandwiched between the first magnetic layer and the second magnetic layer. However, the construction may also be such that either of the magnetic layers is provided, depending on the purpose and design.

Eleventh Embodiment

Figure 23:
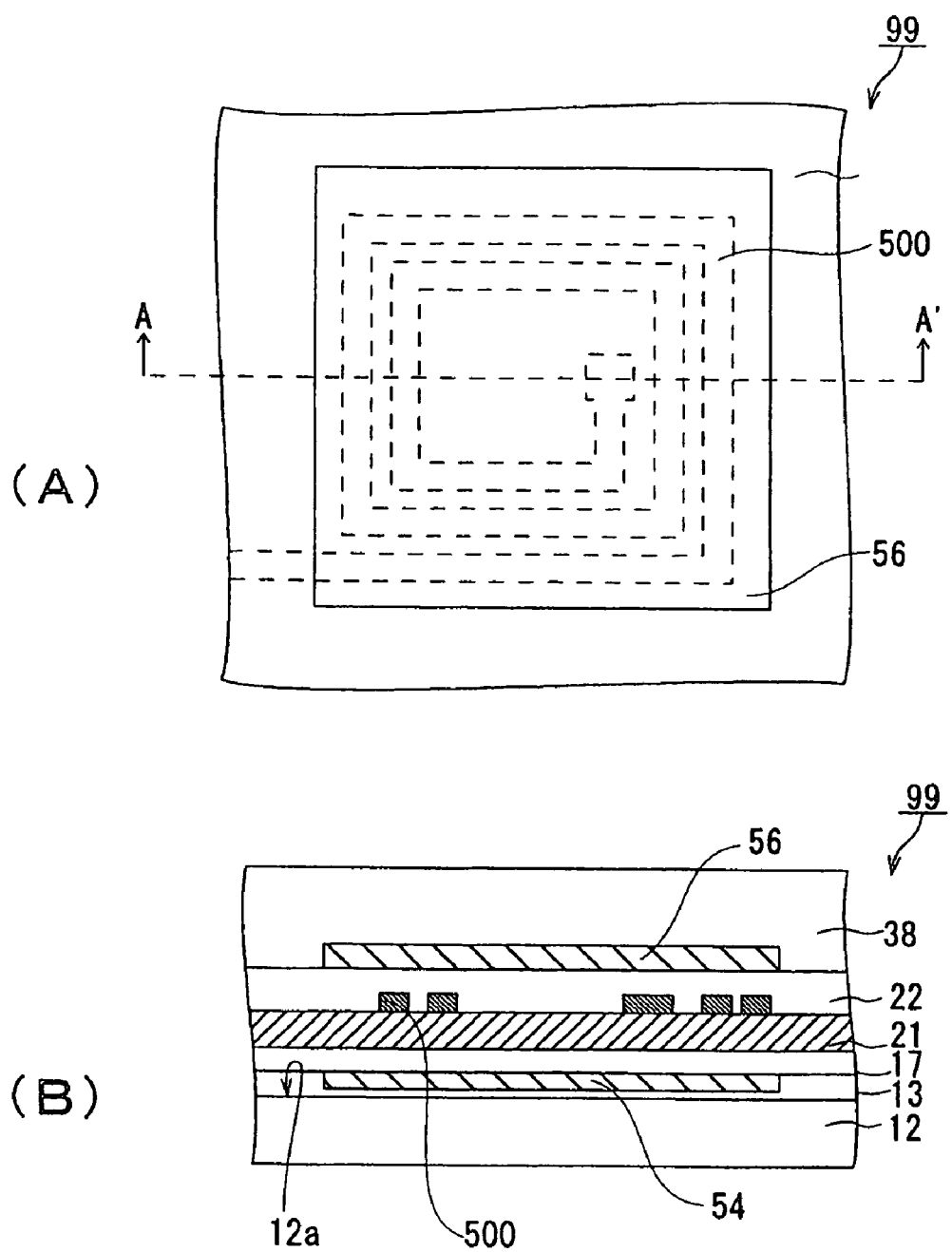
FIGS. 23(A) and 23(B) are diagrams accompanying a description of a semiconductor device of an eleventh embodiment of this invention.
Figure 24:
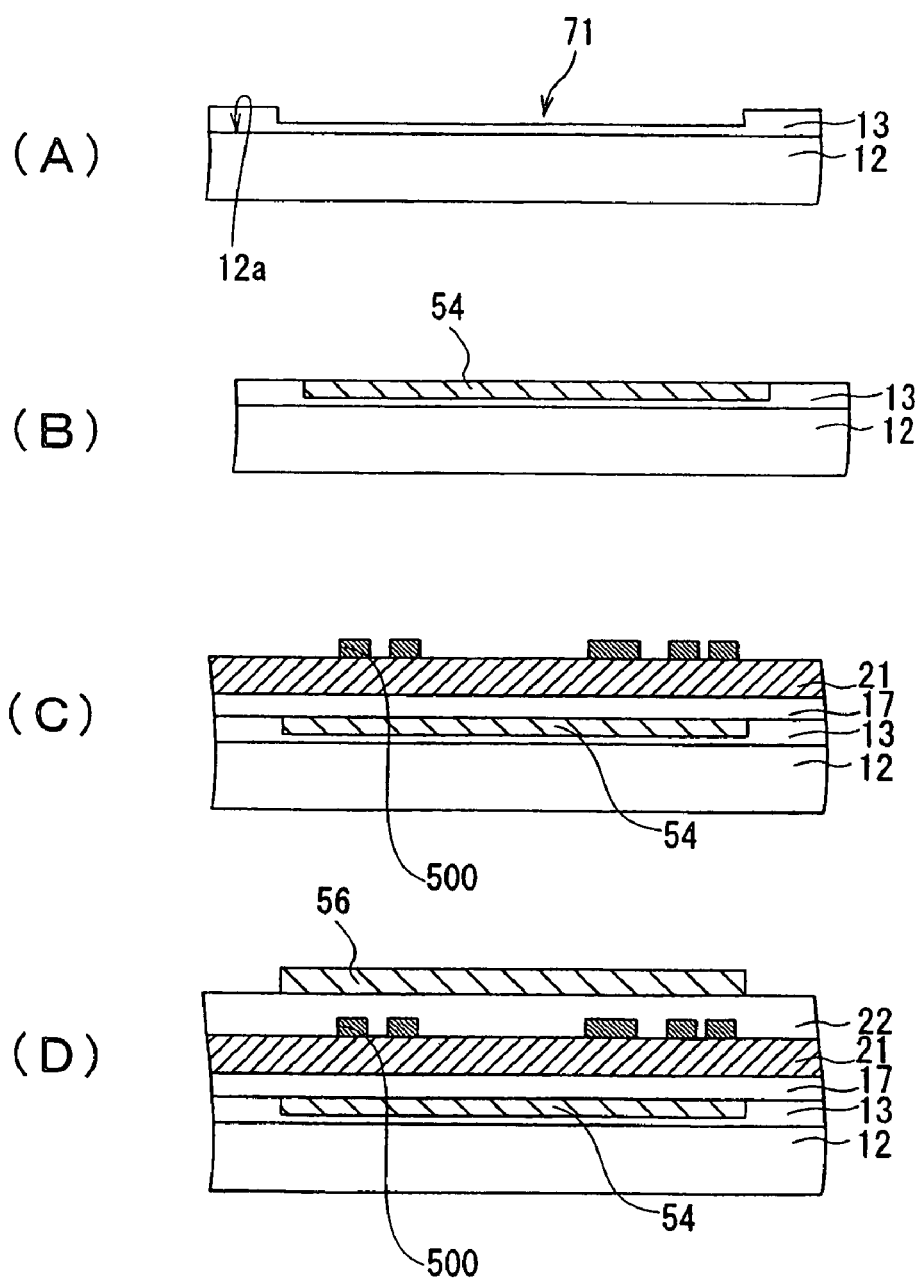
FIGS. 24(A) to 24(D) are diagrams accompanying a description of a production method for the semiconductor device of the eleventh embodiment of this invention.

A semiconductor device according to an eleventh embodiment of this invention is described with reference to FIG. 23 and FIG. 24. FIG. 23 and FIG. 24 are a simplified plan view and an A-A' cross sectional view similar to FIG. 2(A) and FIG. 2(B) respectively. FIG. 23(A) shows a sealing layer 38 omitted, and FIG. 23(B) shows the sealing layer 38 not omitted.

This embodiment differs principally from the tenth embodiment in that a first magnetic layer 54 provided underneath the coil 500 is covered with a passivation coating 17 formed on the top surface of the semiconductor chip 12.

Specifically, as shown in FIGS. 23(A) and (B), a WCSP 99, which is the semiconductor device of this embodiment, has a construction in which a first magnetic layer 54, which is made from iron, is covered with a passivation coating 17 formed on a semiconductor chip 12. Therefore, the construction of the eleventh embodiment differs from that of the tenth embodiment in that the first magnetic layer 54 is embedded in a first insulating layer 13.

Next, a production method for the WCSP 99 which is the semiconductor device of this embodiment is described hereunder, with reference to FIG. 24.

Firstly, after the first insulating layer 13 is formed on the main surface 12a of the semiconductor chip 12, an aperture 71 for forming the first magnetic layer is formed on the surface area of the first insulating layer 13 by means of a photolithography process (FIG. 24 (A)).

Next, the aperture 71 for forming the first magnetic layer is filled up with iron, which is a ferromagnetic material, by means of a plating method, to form the first magnetic layer 54 (FIG. 24(B)).

Then, a passivation coating 17 is formed on the first insulating layer 13 so as to cover the first magnetic layer 54. After that, a second insulating layer 21 is formed on the passivation coating 17. Then, a spiral coil made from copper is formed on the second insulating layer 21 by means of a photolithography process and sputtering and so forth (FIG. 24(C)).

Next, the third insulating layer 22 is formed on the second insulating layer 21 so as to embed the coil 500. Then, after the resist layer is formed on the third insulating layer 22, an aperture (not shown) for forming a second magnetic layer, and which exposes part of the top surface of the third insulating layer 22, is formed by means of a photolithography process. After that, the second magnetic layer 56 made from iron, which is a ferromagnetic material, is formed by means of a plating method. Then, the resist layer is removed (FIG. 24(D)). After that, the sealing layer 38 is formed (FIG. 23(B)).

As is apparent from the description above, with this embodiment, the same effect as for the tenth embodiment can be obtained.

Furthermore, in this embodiment, because the first magnetic layer is formed on the top surface area of the first insulating layer, the fourth insulating layer is not required, and the WCSP is more highly integrated than in the tenth embodiment.

Moreover, this embodiment allows the production processes to be reduced by enabling the first magnetic layer formation to be combined with the wafer process in the step prior to the formation of the passivation coating. As a result, the production cost can be made lower than for the tenth embodiment. In this embodiment the construction is such that the coil is sandwiched between the first magnetic layer and the second magnetic layer. However, the construction may be such that either of the magnetic layers is provided, depending on the purpose and design.

Twelfth Embodiment

Figure 25:
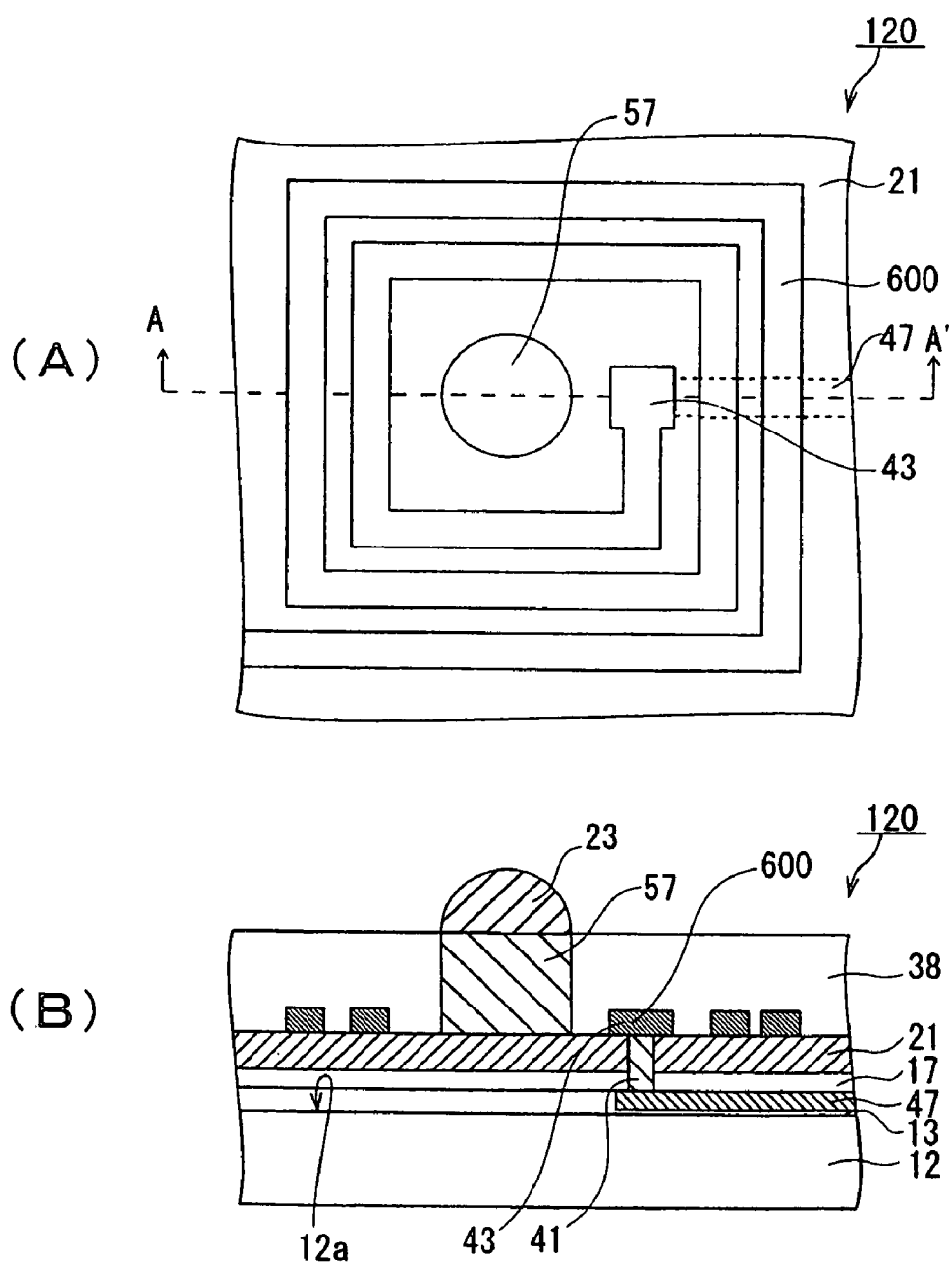
FIGS. 25(A) and 25(B) are diagrams accompanying a description of a semiconductor device of a twelfth embodiment of this invention.

A semiconductor device according to a twelfth embodiment of this invention is described with reference to FIG. 25 and FIG. 26. FIG. 25(A) and FIG. 25(B) are a simplified plan view and an A-A' cross sectional view similar to FIG. 2(A) and FIG. 2(B) respectively. FIG. 25(A) shows a sealing layer 38 omitted, and FIG. 25(B) shows the sealing layer 38 not omitted.

As shown in FIGS. 25(A) and (B), a WCSP 120 of this embodiment has a pseudo-post part 57 provided extending in the direction orthogonal to the main surface 12a of the semiconductor chip 12. A coil 600 that winds in a spiral counter-clockwise toward the central axis of the coil is formed on the top side of a second insulating layer 21 which constitutes a plane orthogonal to the extension direction of the pseudo-post part 57.

Also, a land 43 formed at the end on central axis side of the coil 600 is connected to a rewiring layer 47, which is electrically connected to the semiconductor chip 12 side, through a connection part 41.

Figure 26:
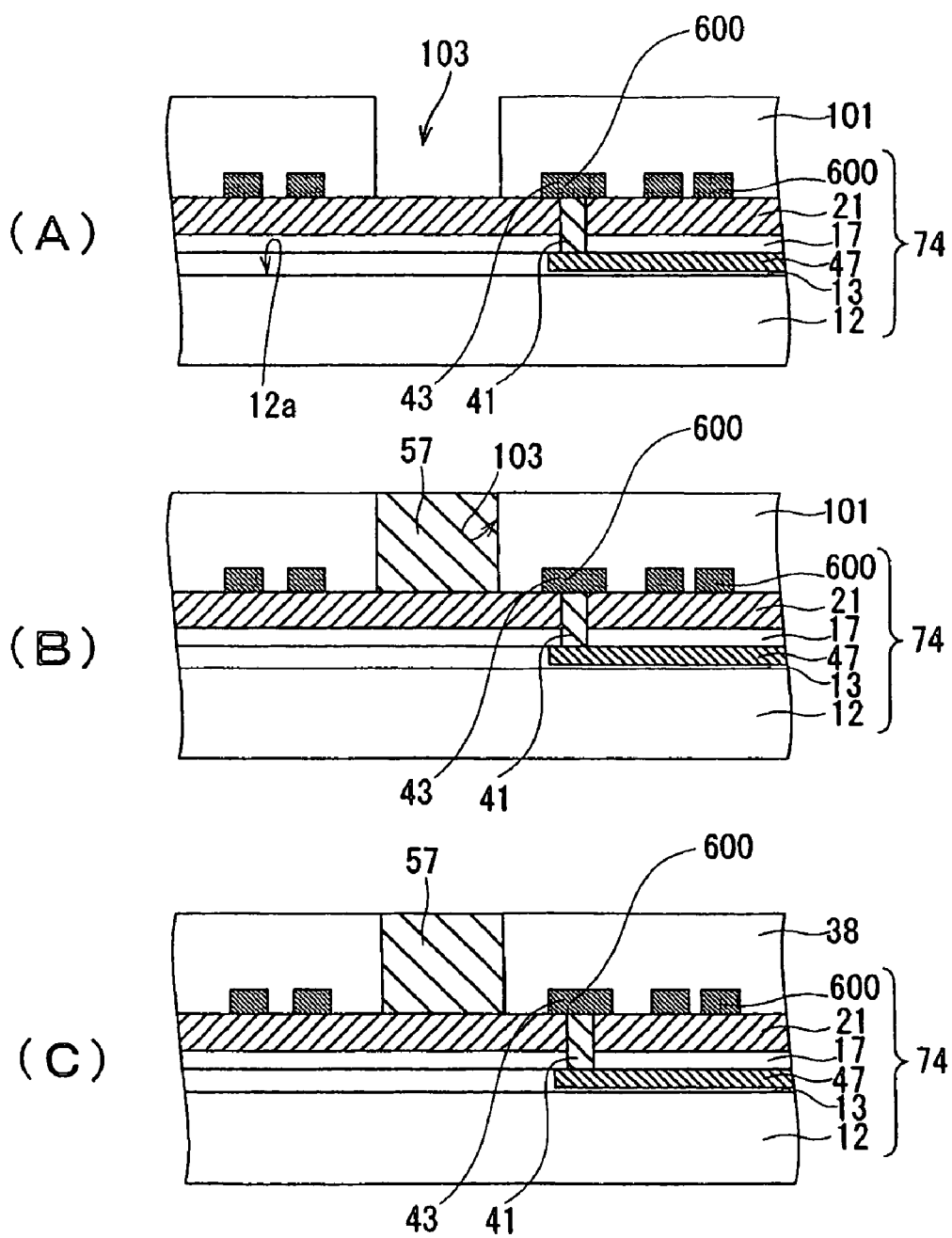
FIGS. 26(A) to 26(C) are diagrams accompanying a description of a production method for the semiconductor device of the twelfth embodiment of this invention.

Next, a production method for the WCSP 120 which is the semiconductor device of this embodiment is described hereunder, with reference to FIG. 26.

Firstly, a first insulating layer 13, a passivation coating 17 and a second insulating layer 21 are sequentially formed on the main surface 12a of the semiconductor chip 12. At this point, the rewiring layer 47 is formed on the surface area of the first insulating layer 13 by means of a conventional well known technique before forming the passivation coating 17. Furthermore, after forming the second insulating layer 21, a connection part 41 which passes though the passivation coating 17 and the second insulating layer 21, and of which its upper end face, that is, its top face, is exposed out of the second insulating layer 21, is formed on the rewiring layer 47.

After that, the spiral coil 600 having one end connected to the connection part 41 is patterned, to obtain a laminate 74 on the second insulating layer 21. Then, after a coating of dry film 101 is formed on the laminate 74, an aperture 103 for forming a pseudo-post part, and which exposes part of the top surface of the second insulating layer 21, is formed by means of a photolithography process (FIG. 26(A)).

Next, the aperture 103 is filled up with iron, which is a ferromagnetic material, by means of a plating method to form the pseudo-post part 57 (FIG. 26(B)).

Then, after the dry film 101 is removed, a sealing layer 38 is formed so that the top end face, that is, the top face, of the pseudo-post part 57 is exposed (FIG. 26(C)). After that, an external terminal 23 is formed on the top end face of the pseudo-post part (FIG. 25(B)).

As described above, with this embodiment, the same effect as for the first embodiment can be obtained.

To conclude, this invention is not restricted by combinations of the embodiments described above. Therefore, this invention can be applied by combining suitable conditions at any suitable stage.

As is apparent from the description above, according to the semiconductor device of this invention, the coil inductance can be increased by a magnetic body provided in the position surrounded by the coil.

Furthermore, comparing the case in which a magnetic body is provided with the case in which an inductance of the same degree is to be obtained without providing such a magnetic body, the area occupied by the coil can be reduced, and enlargement of the semiconductor device can be restrained.

What is claimed is:

1. A semiconductor device, comprising:
    a semiconductor chip provided with a circuit element;
    a coil provided on an upper side of said semiconductor chip, which is packaged with a dimension effectively the same as an outer dimension of said semiconductor chip; and
    a magnetic body provided on an upper side of said semiconductor chip, and surrounded by said coil, wherein
    said magnetic body extends along a main surface of said semiconductor chip,
    said coil forms a substantially spiral shaped conductive path which is wound along an extension direction so as to surround said magnetic body,
    said magnetic body is a substantially tabular body,
    said coil is provided with a first conductive part provided on a first plane parallel with a main surface of said semiconductor chip, a second conductive part provided on a second plane parallely separated in a perpendicular direction with respect to said main surface, and connection parts which electrically connects end parts of said first conductive part and said second conductive part, and
    said first conductive part, said second conductive part, and said connection parts form a substantially spiral shaped conductive path, and
    said connection parts are arranged in two rows at predetermined spacing in the extension direction of said magnetic body, each connection part of each row provided in an offset position.

2. A semiconductor device according to claim 1, further comprising:
    an electrode pad provided on the main surface of said semiconductor chip and electrically connected to said circuit element;
    an insulation layer provided on said semiconductor chip so that one part of a top surface of said electrode pad is exposed;
    external terminals respectively provided at positions different to immediately above said electrode pad;
    a wiring layer provided on a surface of said insulation layer on an opposite side to the semiconductor chip with said insulation layer therebetween, and which electrically connects said electrode pad and said external terminals, wherein
    said coil is provided with a part comprising an a conductive member common with a conductive member constituting said wiring layer.

3. A semiconductor device according to claim 1, wherein said magnetic body is a ferromagnetic body.

* * * * *